(12) United States Patent
Sano et al.

(10) Patent No.: US 9,425,075 B2
(45) Date of Patent: Aug. 23, 2016

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Atsushi Sano, Toyama (JP); Yoshiro Hirose, Toyama (JP); Naonori Akae, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 7 days.

(21) Appl. No.: 14/168,678

(22) Filed: Jan. 30, 2014

(65) Prior Publication Data

US 2014/0220788 A1    Aug. 7, 2014

(30) Foreign Application Priority Data

Feb. 7, 2013 (JP) ................................. 2013-021924

(51) Int. Cl.
*H01L 21/02* (2006.01)
*H01L 21/67* (2006.01)
*C23C 16/30* (2006.01)
(Continued)

(52) U.S. Cl.
CPC ....... *H01L 21/67109* (2013.01); *C23C 16/308* (2013.01); *C23C 16/345* (2013.01); *C23C 16/402* (2013.01); *C23C 16/405* (2013.01); *C23C 16/45525* (2013.01); *H01L 21/0214* (2013.01); *H01L 21/0217* (2013.01); *H01L 21/0228* (2013.01); *H01L 21/02164* (2013.01); *H01L 21/02211* (2013.01); *H01L 21/02219* (2013.01); *H01L 21/02238* (2013.01); *H01L 21/02304* (2013.01); *H01L 21/02326* (2013.01); *H01L 21/02337* (2013.01)

(58) Field of Classification Search
CPC .......... C23C 16/308; C23C 16/45523; H01L 21/0228; H01L 21/02271; H01L 21/02219; H01L 21/02304; H01L 21/02326; H01L 21/02238
See application file for complete search history.

(56) References Cited

U.S. PATENT DOCUMENTS

2008/0102623 A1   5/2008   Hirota et al.
2009/0170345 A1   7/2009   Akae et al.
(Continued)

FOREIGN PATENT DOCUMENTS

JP    11-067690 A    3/1999
JP    2006-190787 A  7/2006
(Continued)

*Primary Examiner* — Kimberly Rizkallah
*Assistant Examiner* — Mounir Amer
(74) *Attorney, Agent, or Firm* — Volpe and Koenig, P.C.

(57) ABSTRACT

The present disclosure suppresses oxidation of a base film on a substrate surface during the formation of an oxide film. A method of manufacturing a semiconductor device according to the present disclosure includes forming an initial layer including a predetermined element and having a thickness of several atomic layers on a substrate in a process chamber by supplying a predetermined-element-containing gas to the substrate, and forming an oxide film including the predetermined element on the initial layer by performing a cycle a predetermined number of times, the cycle including supplying a precursor gas including the predetermined element to the substrate in the process chamber and supplying an oxygen-containing gas and a hydrogen-containing gas to the substrate heated in the process chamber under a pressure lower than an atmospheric pressure.

15 Claims, 14 Drawing Sheets

(51) Int. Cl.
*C23C 16/34* (2006.01)
*C23C 16/40* (2006.01)
*C23C 16/455* (2006.01)

(56) References Cited

U.S. PATENT DOCUMENTS

| | | | |
|---|---|---|---|
| 2010/0105192 A1 | 4/2010 | Akae et al. | |
| 2011/0076857 A1 | 3/2011 | Akae et al. | |
| 2012/0184110 A1* | 7/2012 | Hirose et al. | 438/763 |
| 2013/0017685 A1* | 1/2013 | Akae et al. | 438/703 |
| 2013/0059451 A1 | 3/2013 | Akae et al. | |

FOREIGN PATENT DOCUMENTS

| | | | |
|---|---|---|---|
| JP | 2008-112826 A | 5/2008 | |
| JP | 2010-153776 A | 7/2010 | |
| JP | 2011-061218 A | 3/2011 | |
| KR | 10-2010-0047821 A | 5/2010 | |
| KR | 10-2011-0035935 A | 4/2011 | |
| WO | WO2011/111498 * | 9/2011 | 438/791 |

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-021924, filed on Feb. 7, 2013, the entire contents of which are incorporated herein by reference.

TECHNICAL FIELD

The present disclosure relates to a method of manufacturing a semiconductor device, a substrate processing apparatus, and a recording medium.

BACKGROUND

As a part of processes for manufacturing a semiconductor device such as an MPU (Micro Processing Unit), a DRAM (Dynamic Random Access Memory), and the like, an oxide film that contains a predetermined element is often formed on a substrate by alternately performing, a predetermined number of times, a process of forming a predetermined-element-containing layer on the substrate by supplying a precursor gas containing a predetermined element such as silicon or the like into a process chamber accommodating the substrate therein and a process of oxidizing the predetermined-element-containing layer by supplying an oxygen-containing gas and a hydrogen-containing gas into the process chamber which is kept under a pressure lower than the atmospheric pressure.

However, if the process of forming the oxide film is performed, a base film existing on a substrate surface may be oxidized during the process of forming the oxide layer. This is because oxidizing species generated in the process chamber in the process of oxidizing the predetermined-element-containing layer has a strong oxidizing power. Oxidation of the base film significantly occurs if the base film is formed of a material which is easily oxidized, such as silicon or the like. The oxidation of the base film often deteriorates the quality and throughput of semiconductor devices.

SUMMARY

The present disclosure provides some embodiments of a method of manufacturing a semiconductor device, a substrate processing apparatus, and a recording medium, which are capable of suppressing oxidation of a base film disposed on a substrate surface during the formation of an oxide film.

According to one aspect of the present disclosure, there is provided a method of manufacturing a semiconductor device, including forming an initial layer including a predetermined element and having a thickness of several atomic layers on a substrate in a process chamber by supplying a predetermined-element-containing gas to the substrate; and forming an oxide film including the predetermined element on the initial layer by performing a cycle a predetermined number of times, the cycle including supplying a precursor gas including the predetermined element to the substrate in the process chamber and supplying an oxygen-containing gas and a hydrogen-containing gas to the substrate heated in the process chamber under a pressure lower than an atmospheric pressure.

According to another aspect of the present disclosure, there is provided a substrate processing apparatus, including a process chamber configured to accommodate a substrate; a heater configured to heat the substrate accommodated in the process chamber; a gas supply system configured to supply gas into the process chamber; a pressure regulating unit configured to regulate an internal pressure of the process chamber; and a control unit configured to control the gas supply system, the heater, and the pressure regulating unit so as to perform forming an initial layer including a predetermined element and having a thickness of several atomic layers on the substrate in the process chamber by supplying a predetermined-element-containing gas from the gas supply system to the substrate; and forming an oxide film including the predetermined element on the initial layer by performing a cycle a predetermined number of times, the cycle including supplying a precursor gas including the predetermined element from the gas supply system to the substrate in the process chamber and supplying an oxygen-containing gas and a hydrogen-containing gas from the gas supply system to the substrate heated by the heater in the process chamber under a pressure controlled by the pressure regulating unit to be set lower than an atmospheric pressure.

According to a further aspect of the present disclosure, there is provided a non-transitory computer-readable recording medium storing a program that causes a computer to perform a process of forming an initial layer including a predetermined element and having a thickness of several atomic layers on a substrate in a process chamber by supplying a predetermined-element-containing gas to the substrate; and forming an oxide film including the predetermined element on the initial layer by performing a cycle a predetermined number of times, the cycle including supplying a precursor gas including the predetermined element to the substrate in the process chamber and supplying an oxygen-containing gas and a hydrogen-containing gas to the substrate heated in the process chamber under a pressure lower than an atmospheric pressure.

DETAILED DESCRIPTION

One Embodiment of the Present Disclosure

Hereinafter, one embodiment of the present disclosure will now be described with reference to the accompanying drawings.

(1) Configuration of Substrate Processing Apparatus

Figure 1:
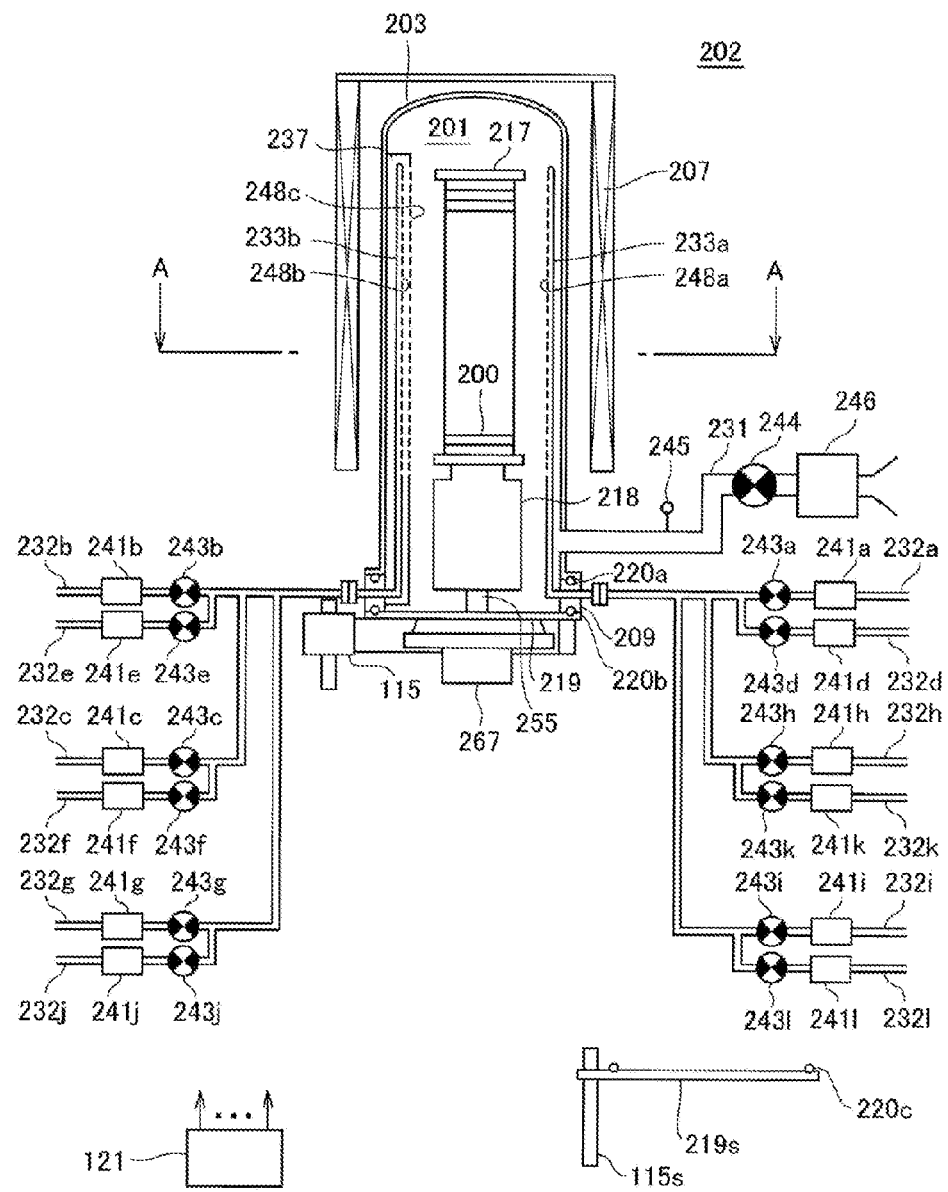
FIG. 1 schematically illustrates a configuration of a vertical processing furnace of a substrate processing apparatus appropriately employed in one embodiment of the present disclosure, in which a portion of the process furnace is shown by a longitudinal sectional view.
Figure 2:
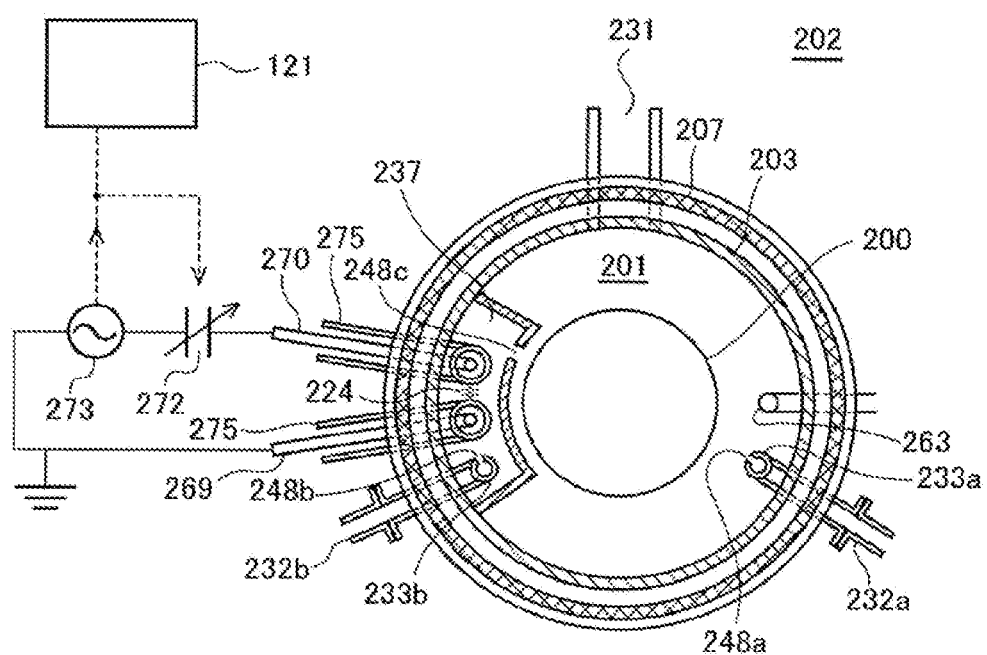
FIG. 2 schematically illustrates a configuration of the vertical processing furnace of the substrate processing apparatus appropriately employed in one embodiment of the present disclosure, in which a portion of the processing furnace is shown by a sectional view taken along a line A-A in FIG. 1.

FIG. 1 schematically illustrates a configuration of a vertical processing furnace 202 of a substrate processing apparatus appropriately employed in one embodiment of the present disclosure, in which a portion of the processing furnace 202 is shown by a longitudinal sectional view. FIG. 2 schematically illustrates a configuration of the vertical processing furnace 202 of the substrate processing apparatus appropriately employed in one embodiment of the present disclosure, in which a portion of the processing furnace 202 is shown by a sectional view taken along a line A-A in FIG. 1.

As illustrated in FIG. 1, the vertical processing furnace 202 includes a heater 207 serving as a heating unit (i.e., heating mechanism). The heater 207 is of a cylindrical shape and is supported by a heater base (not shown) serving as a support plate and is vertically installed. The heater 207 acts as an activation mechanism to activate gas by heat, which will be described later.

A reaction tube 203 is installed inside the heater 207 to be concentric with the heater 207. The reaction tube 203 is made of a heat resistant material such as quartz (i.e., $SiO_2$) or silicon carbide (SiC) and has a cylindrical shape with its upper end closed and its lower end opened. A manifold (e.g., inlet flange) 209 is installed below the reaction tube 203 to be concentric with the reaction tube 203. The manifold 209 is made of a metal, for example, stainless steel, and is formed to have a cylindrical shape with its upper and lower end portions opened. The upper end portion of the manifold 209 engages with the lower end portion of the reaction tube 203 and is configured to support the reaction tube 203. An O-ring 220a as a seal member is installed between the manifold 209 and the reaction tube 203. The manifold 209 is supported on the heater base such that the reaction tube 203 is vertically installed. A process vessel (i.e., reaction vessel) mainly includes the reaction tube 203 and the manifold 209. A process chamber 201 is formed in a hollow cylindrical portion of the process vessel. The process chamber 201 is configured to accommodate wafers 200 as substrates in such a state that the wafers 200 are horizontally arranged in multiple stages along a vertical direction by a boat 217 which will be described later.

A first nozzle 233a as a first gas introduction unit and a second nozzle 233b as a second gas introduction unit penetrate through a sidewall of the manifold 209 to be installed in the process chamber 201. A first gas supply pipe 232a, a fifth gas supply pipe 232h, and a sixth gas supply pipe 232i are connected to the first nozzle 233a. A second gas supply pipe 232b, a third gas supply pipe 232c, and a fourth gas supply pipe 232g are connected to the second nozzle 233b. In this manner, two nozzles 233a and 233b and six gas supply pipes 232a, 232b, 232c, 232g, 232h, and 232i are installed to the reaction tube 203 and configured to supply plural kinds of gases, in this example, six kinds of gases, into the process chamber 201.

A mass flow controller (MFC) 241a serving as a flow rate controller (i.e., a flow rate control unit) and a valve 243a serving as an opening/closing valve are sequentially installed in the first gas supply pipe 232a from an upstream side. A first inert gas supply pipe 232d is connected to the first gas supply pipe 232a at a more downstream side of the valve 243a. A mass flow controller 241d serving as a flow rate controller (i.e., a flow rate control unit) and a valve 243d serving as an opening/closing valve are sequentially installed in the first inert gas supply pipe 232d from an upstream side. In addition, the above described first nozzle 233a is connected to an end portion of the first gas supply pipe 232a. The first nozzle 233a is installed in an arc-shaped space between an inner wall of the reaction tube 203 and the wafers 200 such that the first nozzle 233a extends upward in a stacking direction of the wafers 200 from a lower portion of the inner wall of the reaction tube 203 to an upper portion thereof. Specifically, the first nozzle 233a is installed along a wafer arrangement region where the wafers 200 are arranged, and in a region that horizontally surrounds the wafer arrangement region at a side of the wafer arrangement region. The first nozzle 233a is configured as an L-shaped nozzle, and its horizontal portion is installed to penetrate through the sidewall of the manifold 209 while its vertical portion is installed to ascend at least from one end portion to the other portion of the wafer arrangement region. A gas supply hole 248a for supplying gas is installed at a side surface of the first nozzle 233a. The gas supply hole 248a is opened toward a center of the reaction tube 203 to allow the gas to be supplied to the wafers 200. A plurality of gas supply holes 248a is installed at a predetermined pitch from a lower portion to an upper portion of the reaction tube 203. Each of the gas supply holes 248a may have the same opening area.

A first gas supply system mainly includes the first gas supply pipe 232a, the mass flow controller 241a, and the valve 243a. The first gas supply system may also include the first nozzle 233a. A first inert gas supply system mainly includes the first inert gas supply pipe 232d, the mass flow controller 241d, and the valve 243d. The first inert gas supply system may also serve as a purge gas supply system.

A mass flow controller (MFC) 241b serving as a flow rate controller (i.e., a flow rate control unit) and a valve 243b serving as an opening/closing valve are sequentially installed in the second gas supply pipe 232b from an upstream side. In addition, a second inert gas supply pipe 232e is connected to the second gas supply pipe 232b at a more downstream side of the valve 243b. A mass flow controller 241e serving as a flow rate controller (i.e., a flow rate control unit) and a valve 243e serving as an opening/closing valve are sequentially installed in the second inert gas supply pipe 232e from an upstream side. Further, the second nozzle 233b is connected to an end portion of the second gas supply pipe 232b. The second nozzle 233b is installed within a buffer chamber 237 which serves as a gas dispersion space.

The buffer chamber 237 is installed along the stacking direction of the wafers 200 in the arc-shaped space between the inner wall of the reaction tube 203 and the wafers 200 and in a region spanning from a lower portion of the reaction tube 203 to an upper portion thereof. Thus, the buffer chamber 237 is installed along the wafer arrangement region, and in a region that horizontally surrounds the wafer arrangement region at a side of the wafer arrangement region. A gas supply hole 248c for supplying gas installed at an end portion in a wall of the buffer chamber 237 adjacent to the wafers 200. The gas supply hole 248c is opened toward the center of the reaction tube 203 to allow the gas to be supplied to the wafers 200. A plurality of gas supply holes 248c is installed at a predetermined pitch from a lower portion to an upper portion of the reaction tube 203. Each of the gas supply holes 248c may have the same opening area.

The second nozzle 233b is installed in an end portion in the buffer chamber 237, which opposes the other end portion where the gas supply holes 248c are formed, to ascend upward in the stacking direction of the wafers 200 toward an upper portion from a lower portion of the inner wall of the reaction tube 203. Thus, the second nozzle 233b is installed along the wafer arrangement region where the wafers 200 are arranged, and in a region that horizontally surrounds the wafer arrangement region at a side of the wafer arrangement region. The second nozzle 233b is configured as an L-shaped long nozzle, and its horizontal portion is installed to penetrate through the sidewall of the manifold 209 while its vertical portion is installed to ascend at least from one end portion to the other end portion of the wafer arrangement region. Gas supply holes 248b for supplying gas are installed at a side surface of the second nozzle 233b. The gas supply holes 248b are opened toward the center of the buffer chamber 237. Similar to the gas supply holes 248c of the buffer chamber 237, the gas supply holes 248b are installed from a lower portion to an upper portion of the reaction tube 203. When a pressure difference between an internal pressure of the buffer chamber 237 and an internal pressure of the process chamber 201 is small, the plurality of gas supply holes 248b may be configured to have a constant opening area and a constant opening pitch from an upstream side (i.e., a lower portion) to a downstream side (i.e., an upper portion). On the other hand, when the pressure difference is large, the opening area may become larger and the opening pitch may become smaller in a direction from the upstream side to the downstream side.

In the present embodiment, by adjusting the opening area or the opening pitch of each of the gas supply holes 248b in the second nozzle 233b from the upstream side to the downstream side as described above, gas is flown out from the individual gas supply holes 248b at an almost constant flow rate although there may be a flow velocity difference according to the gas supply holes 248b. The gas flown out from the individual gas supply holes 248b is introduced into the buffer chamber 237 and the flow velocity difference of the gas then becomes uniform within the buffer chamber 237. In this case, particle velocities of the gas flown out from the individual gas supply holes 248b of the second nozzle 233b into the buffer chamber 237 are mitigated within the buffer chamber 237, and the gas is then flown out from the gas supply holes 248c of the buffer chamber 237 into the process chamber 201. Thus, the gas which has been flown out from the individual gas supply holes 248b of the second nozzle 233b into the buffer chamber 237 can have a substantially uniform flow rate and a substantially uniform flow velocity when it is flown out from the gas supply holes 248c of the buffer chamber 237 into the process chamber 201.

A second gas supply system mainly includes the second gas supply pipe 232b, the mass flow controller 241b, and the valve 243b. The second gas supply system may also include the second nozzle 233b and the buffer chamber 237. A second inert gas supply system mainly includes the second inert gas supply pipe 232e, the mass flow controller 241e, and the valve 243e. The second inert gas supply system may also serve as a purge gas supply system.

A mass flow controller (MFC) 241c serving as a flow rate controller (i.e., a flow rate control unit) and a valve 243c serving as an opening/closing valve are sequentially installed in the third gas supply pipe 232c from an upstream side. In addition, a third inert gas supply pipe 232f is connected to the third gas supply pipe 232c at a more downstream side of the valve 243c. A mass flow controller (MFC) 241f serving as a flow rate controller (i.e., a flow rate control unit) and a valve 243f serving as an opening/closing valve are sequentially installed in the third inert gas supply pipe 232f from an upstream side. The end portion of the third gas supply pipe 232c is connected to the second gas supply pipe 232b at a more downstream side of the valve 243b.

A third gas supply system mainly includes the third gas supply pipe 232c, the mass flow controller 241c, and the valve 243c. The third gas supply system may also include a portion of the second gas supply pipe 232b at a more downstream side of the connection portion of the second gas supply pipe 232b and the third gas supply pipe 232c, the second nozzle 233b, and the buffer chamber 237. A third inert gas supply system mainly includes the third inert gas supply pipe 232f, the mass flow controller 241f, and the valve 243f. The third inert gas supply system may also serve as a purge gas supply system.

A mass flow controller (MFC) 241g serving as a flow rate controller (i.e., a flow rate control unit) and a valve 243g serving as an opening/closing valve are sequentially installed in the fourth gas supply pipe 232g from an upstream side. Further, a fourth inert gas supply pipe 232j is connected to the fourth gas supply pipe 232g at a more downstream side of the valve 243g. A mass flow controller (MFC) 241j serving as a flow rate controller (i.e., a flow rate control unit) and a valve 243j serving as an opening/closing valve are sequentially installed in the fourth inert gas supply pipe 232j from an upstream side. An end portion of the fourth gas supply pipe 232g is connected to the second gas supply pipe 232b at a more downstream side of the connection portion of the second gas supply pipe 232b and the third gas supply pipe 232c.

A fourth gas supply system mainly includes the fourth gas supply pipe 232g, the mass flow controller 241g, and the valve 243g. The fourth gas supply system may also include a portion of the second gas supply pipe 232b at a more downstream side of the connection portion of the second gas supply pipe 232b and the fourth gas supply pipe 232g, the second nozzle 233b, and the buffer chamber 237. A fourth inert gas supply system mainly includes the fourth inert gas supply pipe 232j, the mass flow controller 241j, and the valve 243j. The fourth inert gas supply system may also serve as a purge gas supply system.

A mass flow controller (MFC) 241h serving as a flow rate controller (i.e., a flow rate control unit) and a valve 243h serving as an opening/closing valve are sequentially installed in the fifth gas supply pipe 232h from an upstream side. Further, a fifth inert gas supply pipe 232k is connected to the fifth gas supply pipe 232h at a more downstream side of the valve 243h. A mass flow controller (MFC) 241k serving as a flow rate controller (i.e., a flow rate control unit) and a valve 243k serving as an opening/closing valve are sequentially installed in the fifth inert gas supply pipe 232k from an upstream side. An end portion of the fifth gas supply pipe 232h is connected to the first gas supply pipe 232a at a more downstream side of the valve 243a.

A fifth gas supply system mainly includes the fifth gas supply pipe 232h, the mass flow controller 241h, and the valve 243h. The fifth gas supply system may also include a portion of the first gas supply pipe 232a at a more downstream side of the connection portion of the first gas supply pipe 232a and the fifth gas supply pipe 232h and the first nozzle 233a. A fifth inert gas supply system mainly includes the fifth inert gas supply pipe 232k, the mass flow controller 241k, and the valve 243k. The fifth inert gas supply system may also serve as a purge gas supply system.

A mass flow controller (MFC) 241i serving as a flow rate controller (i.e., a flow rate control unit) and a valve 243i serving as an opening/closing valve are sequentially installed in the sixth gas supply pipe 232i from an upstream side. In addition, a sixth inert gas supply pipe 232l is connected to the sixth gas supply pipe 232i at a more downstream side of the valve 243i. A mass flow controller (MFC) 241l serving as a flow rate controller (i.e., a flow rate control unit), and a valve 243l serving as an opening/closing valve are sequentially installed in the sixth inert gas supply pipe 232l from an upstream side. An end portion of the sixth gas supply pipe 232i is connected to the first gas supply pipe 232a at a more downstream side of the connection portion of the first gas supply pipe 232a and the fifth gas supply pipe 232h.

A sixth gas supply system mainly includes the sixth gas supply pipe 232i, the mass flow controller 241i, and the valve 243i. The sixth gas supply system may also include a portion of the first gas supply pipe 232a at a more downstream side of the connection portion of the first gas supply pipe 232a and the sixth gas supply pipe 232i and the first nozzle 233a. A sixth inert gas supply system mainly includes the sixth inert gas supply pipe 232l, the mass flow controller 241l, and the valve 243l. The sixth inert gas supply system may also serve as a purge gas supply system.

As described above, the gas supply method according to the present embodiment transfers gases via the nozzles 233a and 233b and the buffer chamber 237, which are arranged within the arc-shaped longitudinal space defined by the inner wall of the reaction tube 203 and end portions of the stacked wafers 200, and first supplies the gases from the gas supply holes 248a, 248b, and 248c (which are opened in the nozzles 233a and 233b and the buffer chamber 237, respectively) into the reaction tube 203, near the wafers 200. Accordingly, the gases supplied into the reaction tube 2013 mainly flows within the reaction tube 203 in a direction parallel to the surfaces of the wafers 200, i.e., in a horizontal direction. According to the above configuration, the gases can be uniformly supplied to the individual wafers 200, thereby making a thickness of a thin film formed on each of the wafers 200 uniform. In addition, the gases flowing on the surfaces of the wafers 200 after reaction, i.e., residual gases, flow toward an exhaust port, i.e., an exhaust pipe 231, which will be described later. However, the flow direction of the residual gases may be appropriately decided depending on a position of the exhaust port, and is not limited to a vertical direction.

A precursor gas including a predetermined element and a halogen group, for example, a precursor gas containing silicon (Si) as the predetermined element and chlorine (Cl) as a halogen group, i.e., a chloro group, (which may be referred to as a silicon and chlorine-containing gas) such as a hexachlorodisilane ($Si_2Cl_6$, abbreviation: HCDS) gas of a chlorosilane-based precursor gas is supplied from the first gas supply pipe 232a into the process chamber 201 through the mass flow controller 241a, the valve 243a, and the first nozzle 233a. As such, the first gas supply system is configured as a precursor gas supply system (specifically, a chlorosilane-based precursor gas supply system). In the case of employing a liquid precursor such as HCDS which is in a liquid state under the normal temperature and pressure, the liquid precursor (e.g., HCDS) may be vaporized by a vaporizing system such as a vaporizer or a bubbler to be supplied as a gaseous precursor (e.g., HCDS gas). In this case, an inert gas may be supplied from the first inert gas supply pipe 232d into the first gas supply pipe 232a through the mass flow controller 241d and the valve 243d. Here, the HCDS gas may indicate a gas which contains Si and a chloro group.

An oxidizing gas (or oxidation gas), for example, a gas containing oxygen (which may also be referred to as an oxygen-containing gas) such as an oxygen ($O_2$) gas is supplied from the second gas supply pipe 232b into the process chamber 201 through the mass flow controller 241b, the valve 243b, the second gas supply pipe 232b, the second nozzle 233b, and the buffer chamber 237. As such, the second gas supply system is configured as an oxidizing gas supply system. In this case, an inert gas may be supplied from the second inert gas supply pipe 232e into the second gas supply pipe 232b through the mass flow controller 241e and the valve 243e.

A reducing gas (or reduction gas), for example, a gas containing hydrogen (which may also be referred to as a hydrogen-containing gas) such as a hydrogen ($H_2$) gas is supplied from the third gas supply pipe 232c into the process chamber 201 through the mass flow controller 241c, the valve 243c, the second gas supply pipe 232b, the second nozzle 233b, and the buffer chamber 237. As such, the third gas supply system is configured as a reducing gas supply system. In this case, an inert gas may be supplied from the third inert gas supply pipe 232f into the third gas supply pipe 232c through the mass flow controller 241f and the valve 243f.

A nitriding gas, for example, a gas containing nitrogen (which may also be referred to as a nitrogen-containing gas) such as an ammonia ($NH_3$) gas is supplied from the fourth gas supply pipe 232g into the process chamber 201 through the mass flow controller 241g, the valve 243g, the second gas supply pipe 232b, the second nozzle 233b, and the buffer chamber 237. As such, the fourth gas supply system is configured as a nitriding gas supply system. In this case, an inert gas may be supplied from the fourth inert gas supply pipe 232j into the fourth gas supply pipe 232g through the mass flow controller 241j and the valve 243j.

A precursor including a predetermined element and an amino group (or an amine group), for example, an aminosilane-based precursor gas as a precursor gas containing at least silicon (Si) and an amino group, such as a monoaminosilane ($SiH_3R$) gas, is supplied from the fifth gas supply pipe 232h into the process chamber 201 through the mass flow controller 241h, the valve 243h, the first gas supply pipe 232a, and the first nozzle 233a. As such, the fifth gas supply system is configured as an aminosilane-based precursor gas supply system. In the case of employing a liquid precursor such as $SiH_3R$ which is in a liquid state under the normal temperature and pressure, the liquid precursor (e.g., $SiH_3R$) may be vaporized by a vaporizing system such as a vaporizer or a bubbler to be supplied as a gaseous precursor (e.g., $SiH_3R$ gas). In this case, an inert gas may be supplied from the fifth inert gas supply pipe 232k into the fifth gas supply pipe 232h through the mass flow controller 241k and the valve 243k.

A precursor containing a predetermined element, for example, a silane-based precursor gas containing silicon (Si) but not containing chlorine (Cl), nitrogen (N), and oxygen (O), in other words, an inorganic silane-based precursor gas such as a monosilane ($SiH_4$) is supplied from the sixth gas supply pipe 232i into the process chamber 201 through the mass flow controller 241i, the valve 243i, the first gas supply pipe 232a, and the first nozzle 233a. As such, the sixth gas supply system is configured as an inorganic silane-based precursor gas supply system. In this case, an inert gas may be supplied from the sixth inert gas supply pipe 232l into the sixth gas supply pipe 232i through the mass flow controller 241l and the valve 243l.

The chlorosilane-based precursor gas, the aminosilane-based precursor gas, and the inorganic silane-based precursor gas commonly contain a predetermined element (i.e., silicon) and thus may be collectively referred to as a precursor gas containing a predetermined element (which may also be referred to as a predetermined-element-containing gas). The chlorosilane-based precursor gas may be referred to as a predetermined-element-containing gas including a halogen group (or a chloro group). The aminosilane-based precursor gas may be referred to as a predetermined-element-containing gas including an amino group.

In the present embodiment, the HCDS gas, the $SiH_3R$ gas, and the $SiH_4$ gas are supplied into the process chamber 201 from the same nozzle. Alternatively, the HCDS gas, the $SiH_3R$ gas, and the $SiH_4$ gas may be supplied into the process chamber 201 from different nozzles. However, employing a single nozzle for supplying different kinds of gases has an advantage in reducing the number of nozzles, curtailing the apparatus cost, and facilitating the maintenance and repair.

In the present embodiment, the $O_2$ gas, the $H_2$ gas, and the $NH_3$ gas are supplied into the process chamber 201 (or the buffer chamber 237) from the same nozzle. Alternatively, the $O_2$ gas, the $H_2$ gas, and the $NH_3$ gas may be supplied into the process chamber 201 from different nozzles. However, employing a singles nozzle for supplying different kinds of gases has an advantage in reducing the number of nozzles, curtailing the apparatus cost, and facilitating the maintenance and repair. The nozzle for supplying the HCDS gas and the nozzle for supplying the $H_2$ gas may be the same. In other words, the HCDS gas and the $H_2$ gas may be supplied from the same nozzle. In a film forming temperature range which will be described later, the HCDS gas does not react with the $H_2$ gas but reacts with the $O_2$ gas and the $NH_3$ gas. Thus, it may be desirable that the nozzle for supplying the HCDS gas and the nozzle for supplying the $O_2$ gas and the $NH_3$ gas are independent of each other.

In the buffer chamber 237, as illustrated in FIG. 2, a first rod-shaped electrode 269 serving as a first electrode having an elongated structure and a second rod-shaped electrode 270 serving as a second electrode having an elongated structure are installed from a lower portion to an upper portion of the reaction tube 203 in the stacking direction of the wafers 200. Each of the first rod-shaped electrode 269 and the second rod-shaped electrode 270 is installed in parallel to the second nozzle 233b. Each of the first rod-shaped electrode 269 and the second rod-shaped electrode 270 is covered with and protected by an electrode protection tube 275, which is a protection tube for protecting each electrode from an upper portion to a lower portion thereof. One of the first rod-shaped electrode 269 and the second rod-shaped electrode 270 is connected to a high-frequency power source 273 through a matching unit 272, and the other is connected to a ground corresponding to a reference electric potential. By applying high-frequency electric power from the high-frequency power source 273 between the first rod-shaped electrode 269 and the second rod-shaped electrode 270 through the matching unit 272, plasma is generated in a plasma generation region 224 between the first rod-shaped electrode 269 and the second rod-shaped electrode 270. A plasma source as a plasma generator (i.e., plasma generating unit) mainly includes the first rod-shaped electrode 269, the second rod-shaped electrode 270, and the electrode protection tubes 275. The plasma source may also include the matching unit 272 and the high-frequency power source 273. Also, as will be described later, the plasma source serves as an activating mechanism that activates gas with plasma.

Each of the electrode protection tubes 275 has a structure in which either the first rod-shaped electrode 269 or the second rod-shaped electrode 270 is inserted into the buffer chamber 237 in a state where the inserted rod-shaped electrode is isolated from an internal atmosphere of the buffer chamber 237. In this case, if an internal oxygen concentration in the electrode protection tube 275 is substantially equal to an oxygen concentration in the ambient air (i.e., atmosphere), the first rod-shaped electrode 269 and the second rod-shaped electrode 270 inserted into the electrode protection tubes 275 may be oxidized by the heat generated by the heater 207. Therefore, by charging the inside of the electrode protection tube 275 with an inert gas such as a nitrogen gas, or by purging the inside of the electrode protection tube 275 with an inert gas such as a nitrogen gas using an inert gas purging mechanism, the internal oxygen concentrations of the electrode protection tubes 275 decrease and thus, oxidation of the first rod-shaped electrode 269 and the second rod-shaped electrode 270 can be prevented.

The exhaust pipe 231 for exhausting an internal atmosphere of the process chamber 201 is installed in the reaction tube 203. A vacuum pump 246 serving as a vacuum exhaust device is connected to the exhaust pipe 231 through a pressure sensor 245 as a pressure detector (i.e., a pressure detecting unit) for detecting an internal pressure of the process chamber 201 and an auto pressure controller (APC) valve 244 serving as a pressure regulator (i.e., a pressure regulating unit). The APC valve 244 is configured to perform or stop vacuum-exhaust in the process chamber 201 by opening or closing the valve 244 with the actuated vacuum pump 246 and further to regulate the internal pressure of the process chamber 201 by adjusting an opening degree of the valve 244 with the actuated vacuum pump 246. An exhaust system mainly includes the exhaust pipe 231, the APC valve 244, and the pressure sensor 245. The exhaust system may also include the vacuum pump 246. The exhaust system is configured to, while operating the vacuum pump 246, adjust the opening degree of the APC valve 244 based on the pressure information detected by the pressure sensor 245 such that the internal pressure of the process chamber 201 is vacuum-exhausted to a predetermined pressure (i.e., predetermined vacuum level). The exhaust pipe 231 may not be installed in the reaction tube 203 but may be installed in the manifold 209 in a similar manner to the first nozzle 233a and the second nozzle 233b.

A seal cap 219, which functions as a furnace port cover configured to hermetically seal a lower end opening of the reaction tube 203, is installed below the manifold 209. The seal cap 219 is configured to make contact with a lower end of the manifold 209 from its bottom in the vertical direction. The seal cap 219 is made of, for example, metal such as stainless steel or the like and is formed in a disc shape. An O-ring 220b as a seal member making contact with the lower end portion of the manifold 209 is installed on the upper surface of the seal cap 219. A rotation mechanism 267 configured to rotate the boat 217 as a substrate holder, which will be described later, is installed at an opposite side of the seal cap 219 with respect to the process chamber 201. The rotation mechanism 267 includes a rotary shaft 255 made of, for example, metal such as stainless steel or the like and is connected to the boat 217 through the seal cap 219. The rotation mechanism 267 is configured to rotate the wafers 200 by rotating the boat 217. The seal cap 219 is configured to be vertically elevated or lowered by a boat elevator 115 as an elevating mechanism vertically installed outside the reaction tube 203. The boat elevator 115 is configured to enable the boat 217 to be loaded into or unloaded from the process chamber 201 by elevating or lowering the seal cap 219. Specifically, the boat elevator 115 is configured as a transfer device (i.e., a transfer mechanism) that transfers the boat 217, i.e., the wafers 200, into and out of the process chamber 201. Installed below the manifold 209 is a shutter 219s as a furnace port cover capable of hermetically sealing the lower end opening of the manifold 209 when the seal cap 219 is lowered by the boat elevator 115. Similar to the seal cap 219, the shutter 219s is made of, for example, metal such as a stainless steel or the like and is formed in a disc shape. An O-ring 220c as a seal member making contact with the lower end portion of the manifold 209 is installed on the upper surface of the shutter 219s. The opening/closing operation (i.e., elevating/lowering operation or rotating operation) of the shutter 219s is controlled by a shutter opening/closing mechanism 115a installed outside the reaction tube 203.

The boat 217, which is used as a substrate support, is made of, for example, a heat resistant material such as quartz or silicon carbide and is configured to support the wafers 200 horizontally stacked in multiple stages with the centers of the wafers 200 concentrically aligned. In addition, a heat insulating member 218 formed of, for example, a heat resistant material such as quartz or silicon carbide is installed below the boat 217 and is configured such that the heat generated from the heater 207 is hardly transferred to the seal cap 219. Moreover, the heat insulating member 218 may be configured by a plurality of heat insulating plates made of a heat resistant material such as quartz or silicon carbide and a heat insulating plate holder configured to support the heat insulating plates in a horizontal posture in multiple stages.

As illustrated in FIG. 2, a temperature sensor 263 as a temperature detector is installed within the reaction tube 203. Based on temperature information detected by the temperature sensor 263, a state of supplying an electric current to the heater 207 is adjusted such that the internal temperature of the process chamber 201 set to a desired temperature distribution. Similar to the first nozzle 233a and the second nozzle 233b, the temperature sensor 263 is formed as an L-like shape and installed along the inner wall of the reaction tube 203.

Figure 3:
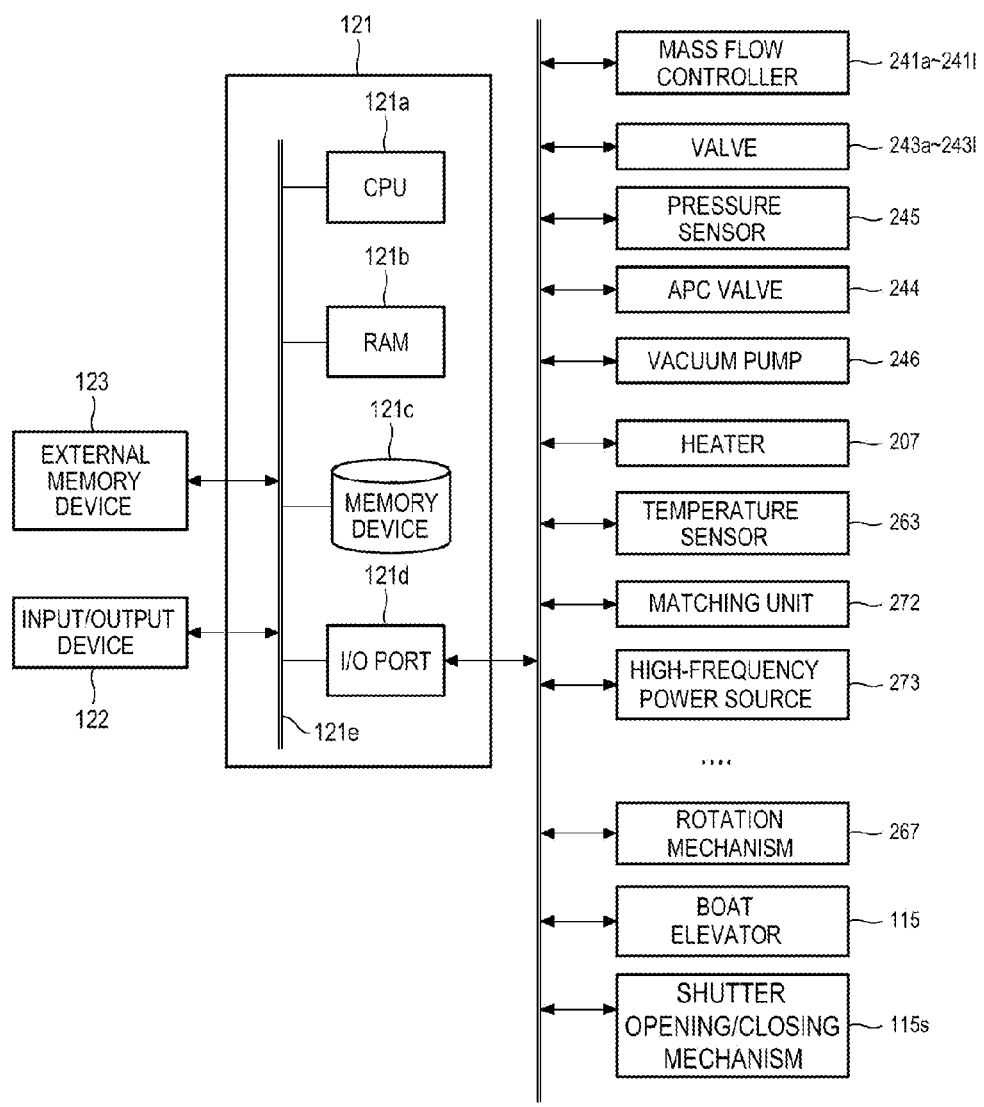
FIG. 3 schematically illustrates a configuration of a controller of a substrate processing apparatus appropriately employed in one embodiment of the present disclosure, in which its control system is shown as a block diagram.

As illustrated in FIG. 3, a controller 121 as a control unit (or a control part) is configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 including, for example, a touch panel or the like, is connected to the controller 121.

The memory device 121c is configured with, for example, a flash memory, a hard disc drive (HDD), or the like. A control program for controlling operations of the substrate processing apparatus or a process recipe defining film forming sequences or film forming conditions, which will be described later, is readably stored in the memory device 121c. The process recipe, which serves as a program, is configured to cause the controller 121 to execute individual sequences in the substrate processing process which will be described later so that predetermined results are obtained. Hereinafter, such a process recipe or a control program may be collectively referred to as "a program." As user herein, the term "program" may indicate only a process recipe, only a control program, or both a process recipe and a control program. In addition, the RAM 121b is configured as a memory area (or work area) in which a program or data read by the CPU 121a is temporarily stored.

The I/O port 121d is connected to the mass flow controllers 241a, 241b, 241c, 241d, 241e, 241f, 241g, 241h, 241i, 241j, 241k, and 241l, the valves 243a, 243b, 243c, 243d, 243e, 243f, 243g, 243h, 243i, 243j, 243k, and 243l, the pressure sensor 245, the APC valve 244, the vacuum pump 246, the heater 207, the temperature sensor 263, the rotation mechanism 267, the boat elevator 115, the high-frequency power source 273, the matching unit 272, the shutter opening/closing mechanism 115s, and the like.

The CPU 121a is configured to read the control program from the memory device 121c and execute the control program. The CPU 121a is configured to read the process recipe from the memory device 121c in response to an input as an operation command from the input/output device 122. In addition, the CPU 121a is configured to, according to content of the read process recipe, control the flow rate controlling operations for various kinds of gases performed by the mass flow controllers 241a, 241b, 241c, 241d, 241e, 241f, 241g, 241h, 241i, 241j, 241k, and 241l, the opening/closing operations of the valves 243a, 243b, 243c, 243d, 243e, 243f, 243g, 243h, 243i, 243j, 243k, and 243l, the opening/closing operation of the APC valve 244, the pressure regulating operation performed by the APC valve 244 based on the pressure sensor 245, the temperature regulating operation of the heater 207 based on the temperature sensor 263, the operation of starting and stopping the vacuum pump 246, the operations of rotating the boat 217 and adjusting the rotation speed of the boat 217 rotated by the rotation mechanism 267, the elevating/lowering operation of the boat 217 performed by the boat elevator 115, the operation of supplying electric power performed by the high-frequency power source 273, the impedance adjusting operation performed by the matching unit 272, the opening/closing operation of the shutter 219s performed by the shutter opening/closing mechanism 115s, and the like.

Moreover, the controller 121 is not limited to being configured as a dedicated computer but may be configured as a general-purpose computer. For example, the controller 121 in the present embodiment may be configured by installing the above described program on the general-purpose computer using an external memory device 123 in which the program is stored (e.g., a magnetic tape, a magnetic disc such as a flexible disc or a hard disc, an optical disc such as a CD or DVD, a magneto-optical disc such as an MO or the like, a semiconductor memory such as a USB memory or a memory card). Furthermore, means for supplying a program to a computer is not limited to the case in which the program is supplied through the external memory device 123. For example, the program may be supplied using communication means such as the Internet or a dedicated line without going through the external memory device 123. Moreover, the memory device 121c or the external memory device 123 may be configured as a non-transitory computer-readable recording medium. Hereinafter, these means for supplying the program will be simply referred to as "a recording medium." In addition, the term "recording medium" used herein is intended to include only the memory device 121c, only the external memory device 123, or both of them.

(2) Substrate Processing Process

An example of a method for forming a predetermined-element-containing initial layer having a thickness of several atomic layers on a substrate and then forming a predetermined-element-containing oxide film on the substrate, by using the above described processing furnace 202 of the substrate processing apparatus, will be described as one of processes of manufacturing a semiconductor device. In the following descriptions, the operations of the respective parts constituting the substrate processing apparatus are controlled by the controller 121.

Figure 4:
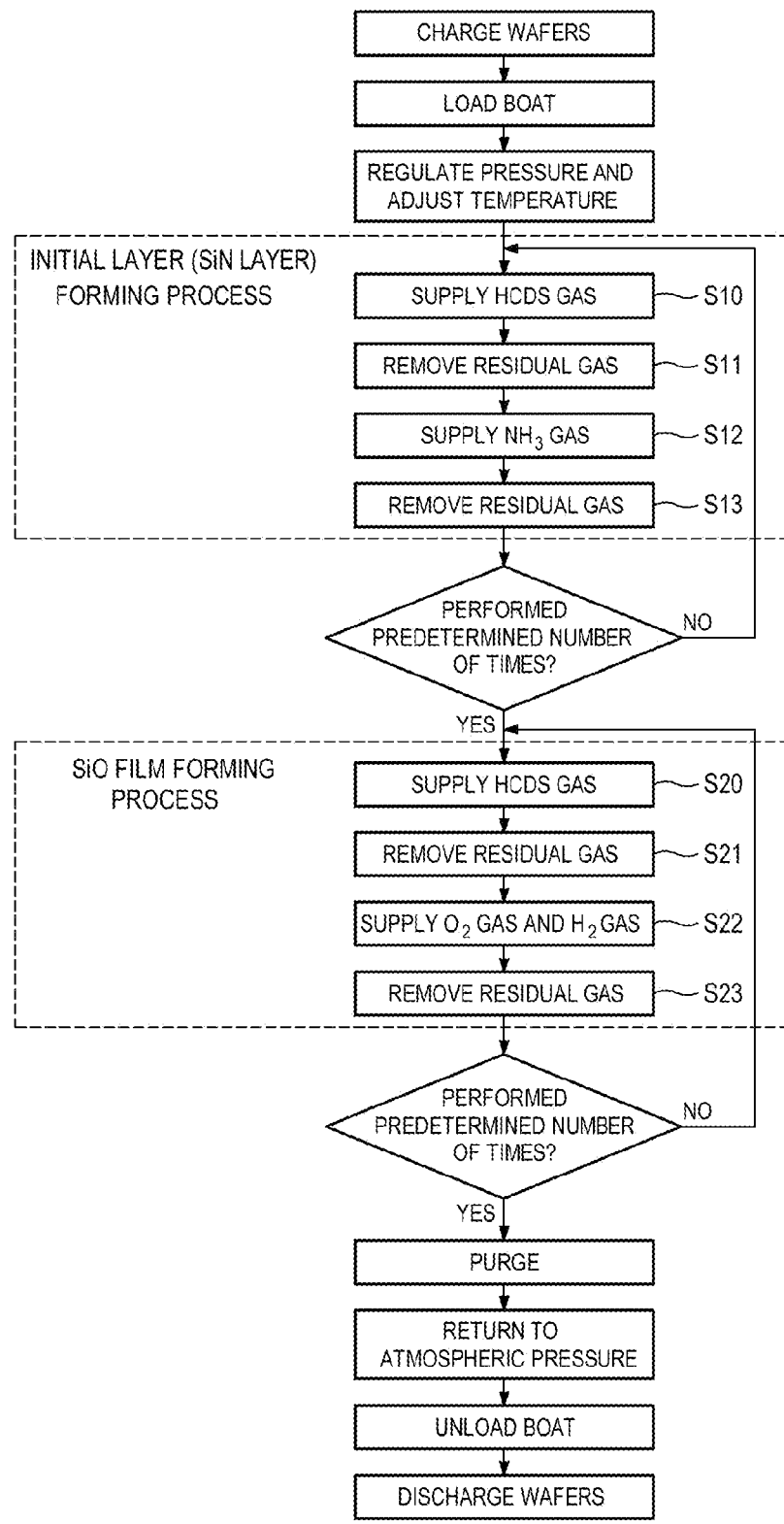
FIG. 4 illustrates a flowchart of processing according to a first embodiment of the present disclosure.
Figure 5:
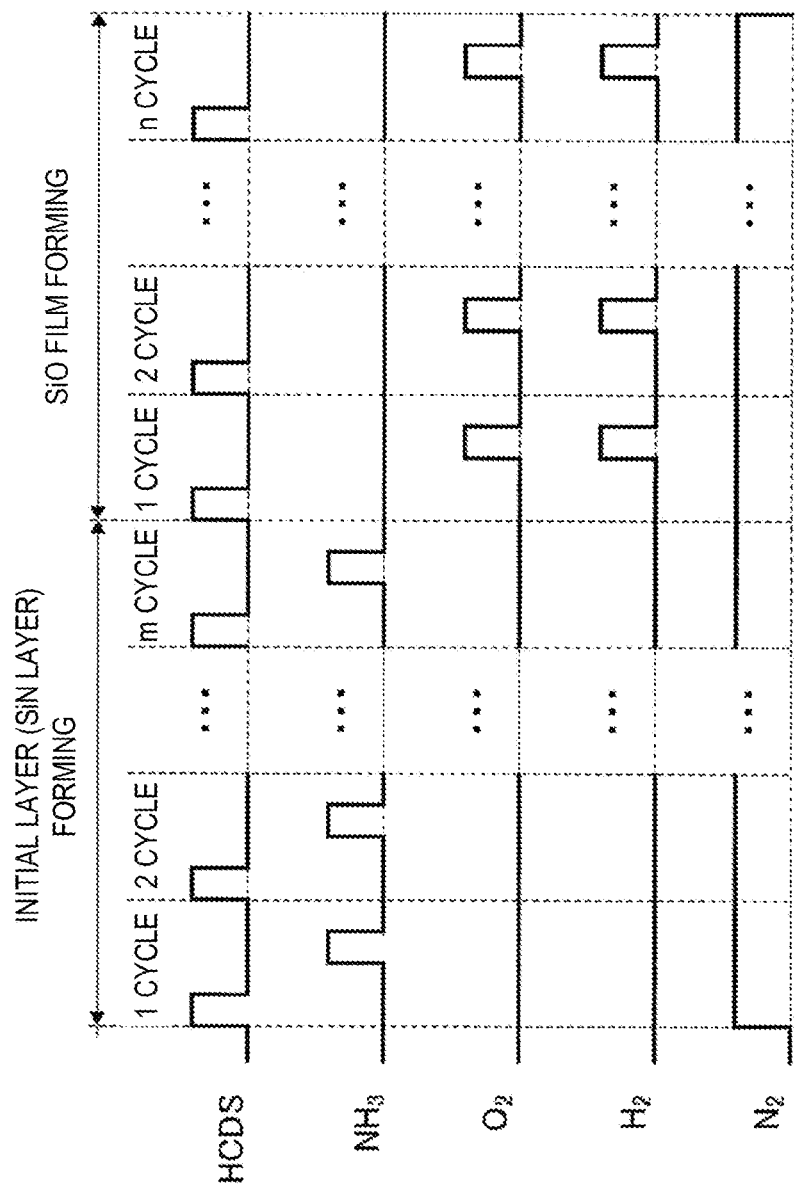
FIG. 5 illustrates gas supply timings in a film forming sequence according to the first embodiment of the present disclosure.

A film forming sequence according to the present embodiment will be described in detail with reference to FIGS. 4 and 5. FIG. 4 illustrates a flowchart of processing according to a first embodiment of the present disclosure. FIG. 5 illustrates gas supply timings in a film forming sequence according to the first embodiment of the present disclosure.

An example for a film forming sequence will be described in which an HCDS gas (i.e., chlorosilane-based precursor gas) as a precursor gas, an $NH_3$ gas as a nitrogen-containing gas, an $O_2$ gas as an oxygen-containing gas, and a $H_2$ gas as a hydrogen-containing gas are used. In this example, the film forming sequence includes a process for forming a silicon nitride layer (SiN layer) or a silicon-rich SiN layer as an initial layer on a wafer 200 by alternately supplying, a predetermined number of times (e.g., m times), the HCDS gas and the $NH_3$ gas into a process vessel accommodating the wafer 200 as a substrate; and a process for forming a silicon oxide film ($SiO_2$ film, which may be referred to as a SiO film hereinafter) on the SiN layer or the silicon-rich SiN layer by alternately performing, a predetermined number of times (e.g., n times), a step of supplying the HCDS gas and a step of supplying the $O_2$ gas and the $H_2$ gas.

(Wafer Charging and Boat Loading)

When a plurality of wafers 200 are charged into the boat 217 (i.e., wafer charging), the shutter 219s is moved by the shutter opening/closing mechanism 115s. Thus, the lower end opening of the manifold 209 gets opened (i.e., shutter opening). As illustrated in FIG. 1, the boat 217 charged with the wafers 200 is lifted upward by the boat elevator 115 and is loaded into the process chamber 201 (i.e., boat loading). In this state, the seal cap 219 seals the lower end portion of the manifold 209 via the O-ring 220b.

(Pressure Regulation and Temperature Adjustment)

The interior of the process chamber 201 is vacuum-exhausted by the vacuum pump 246 to a desired pressure (or desired vacuum level). In this case, the internal pressure of the process chamber 201 is measured by the pressure sensor 245. The APC valve 244 is feedback-controlled based on the measured pressure information (i.e., pressure regulation). The vacuum pump 246 may be continuously operated at least until the processing of the wafers 200 is completed. The process chamber 201 is heated by the heater 207 to a desired temperature. In this case, the state of supply of an electric current to the heater 207 is feedback-controlled based on the temperature information detected by the temperature sensor 263 such that the interior of the process chamber 201 reaches a desired temperature distribution (i.e., temperature adjustment). In addition, the heating operation of the interior of the process chamber 201 by the heater 207 may be continuously performed at least until the processing of the wafers 200 is completed. Subsequently, the boat 217 and the wafers 200 begin to be rotated by the rotation mechanism 267. Furthermore, the rotation of the boat 217 and the wafers 200 by the rotation mechanism 267 may be continuously performed at least until the processing of the wafers 200 is completed.

<Process for Forming Initial Layer (SiN Layer)>

A cycle including steps S10 to S13, which will be described below, is then performed a predetermined number of times, specifically, a plurality of times, so that a SiN layer or a silicon-rich SiN layer as an initial layer having a thickness of several atomic layers is formed on the wafer 200.

[Step S10]

The valve 243a of the first gas supply pipe 232a is opened to allow the HCDS gas to flow through the first gas supply pipe 232a. A flow rate of the HCDS gas flowing from the first gas supply pipe 232a is adjusted by the mass flow controller 241a. The flow-rate-adjusted HCDS gas is supplied from the gas supply holes 248a of the first nozzle 233a into the process chamber 201 maintained in a heated and depressurized state and is exhausted through the exhaust pipe 231. As such, the HCDS gas is supplied to the wafers 200 (i.e., HCDS gas supply).

In this case, the valve 243d of the first inert gas supply pipe 232d may be opened so that an $N_2$ gas as an inert gas can be supplied from the first inert gas supply pipe 232d. A flow rate of the $N_2$ gas is adjusted by the mass flow controller 241d. The $N_2$ gas is supplied into the first gas supply pipe 232a. The flow-rate-adjusted $N_2$ gas is mixed with the flow-rate-adjusted HCDS gas within the first gas supply pipe 232a. The $N_2$ gas is supplied from the gas supply holes 248a of the first nozzle 233a into the process chamber 201 maintained in a heated and depressurized state and is exhausted through the exhaust pipe 231. During this operation, the valves 243e, 243f, 243j, 243k, and 243l are opened to allow the $N_2$ gas to flow through the second inert gas supply pipe 232e, the third inert gas supply pipe 232f, the fourth inert gas supply pipe 232j, the fifth inert gas supply pipe 232k, and the sixth inert gas supply pipe 232l in order to prevent the HCDS gas from infiltrating into the buffer chamber 237, the second nozzle 233b, the fifth gas supply pipe 232h, and the sixth gas supply pipe 232i. The $N_2$ gas flowing through the second gas supply pipe 232b, the third gas supply pipe 232c, and the fourth gas supply pipe 232g is supplied into the process chamber 201 through the second nozzle 233b and the buffer chamber 237 and exhausted through the exhaust pipe 231.

In this case, the APC valve 244 is appropriately adjusted such that the internal pressure of the process chamber 201 falls within, for example, a range of 1 to 13,300 Pa, specifically, 10 to 1,330 Pa. The flow rate of the HCDS gas controlled by the mass flow controller 241a is set to fall within, for example, a range of 1 to 1,000 sccm. Each flow rate of the $N_2$ gas controlled by the mass flow controllers 241d, 241e, 241f, 241j, 241k, and 241l is set to fall within, for example, a range of 100 to 2,000 sccm. A time during which the HCDS gas is supplied to the wafers 200, in other words, a gas supply time (i.e., a gas irradiation time) is set to fall within, for example, a range of 1 to 120 seconds. In this case, the temperature of the heater 207 is set such that the temperature of the wafers 200 falls within, for example, a range of 350 to 800 degree C., specifically, 450 to 800 degree C., more specifically, 550 to 750 degree C.

As the HCDS gas is supplied, a silicon-containing layer having a thickness, for example, from less than one atomic layer to several atomic layers is formed on the wafer 200 (e.g., on a base film of a surface of the wafer 200). The silicon-containing layer may be an adsorption layer of the HCDS gas, a silicon layer (i.e., Si layer), or may include both the adsorption layer and the silicon layer. However, the silicon-containing layer may be a layer which contains silicon (Si) and chlorine (Cl).

The term "silicon layer" used herein is a generic name which encompasses a continuous layer formed of silicon (Si), a discontinuous layer, and a silicon thin film generated by superimposing a continuous layer and a discontinuous layer. The continuous layer formed of silicon (Si) is sometimes referred to as a "silicon thin film." Si constituting the silicon layer includes Si whose bond to Cl is not completely broken. The adsorption layer of the HCDS gas includes not only a continuous chemical adsorption layer of molecules of the HCDS gas but also a discontinuous chemical adsorption layer. In other words, the adsorption layer of the HCDS gas includes a chemical adsorption layer formed of HCDS molecules and having a thickness of one molecular layer or less than one molecular layer. HCDS ($Si_2Cl_6$) molecules constituting the adsorption layer of the HCDS gas includes one or more molecules in which a bond between Si and Cl is partially broken (e.g., $Si_xCl_y$ molecules). In other words, the adsorption layer of the HCDS gas includes a continuous chemical adsorption layer and a discontinuous chemical adsorption layer of $Si_2Cl_6$ molecules and/or $Si_xCl_y$ molecules.

A layer having a thickness of less than one atomic layer refers to a discontinuously formed atomic layer. A layer having a thickness of one atomic layer refers to a continuously formed atomic layer. In addition, the layer having a thickness of less than one molecular layer refers to a discontinuously formed molecular layer. A layer having a thickness of one molecular layer refers to a continuously formed molecular layer.

Under a condition in which the HCDS gas is autolyzed (or pyrolyzed), i.e., under a condition in which a pyrolysis reaction of the HCDS gas occurs, Si is deposited on the wafer 200 to form the silicon layer. Under a condition in which the HCDS gas is not autolyzed (or pyrolyzed), i.e., under a condition in which a pyrolysis reaction of the HCDS gas does not occur, the HCDS gas is adsorbed onto the wafer 200 to form the adsorption layer of the HCDS gas. In addition, a film forming rate can be made higher when forming the silicon layer on the wafer 200 than when forming the adsorption layer of the HCDS gas on the wafer 200. Thus, it may be preferred to form the silicon layer on the wafer 200.

If the thickness of the silicon-containing layer formed on the wafer 200 (e.g., on the base film of a surface of the wafer 200) exceeds several atomic layers, a nitriding (i.e., modifying) operation in step S12, which will be described later, does not affect the entire silicon-containing layer. In addition, the minimum value of the thickness of the silicon-containing layer that can be formed on the wafer 200 is less than one atomic layer. Accordingly, the thickness of the silicon-containing layer may be from less than one atomic layer to several atomic layers. In addition, if the thickness of the silicon-containing layer is set to be one atomic layer or less, i.e., one atomic layer or less than one atomic layer, it is possible to relatively increase the effect of the nitriding (i.e., modifying) reaction in Step S12, which will be described later. This makes it possible to shorten a time required for the modifying reaction in step S12. It is also possible to shorten a time required for forming the silicon-containing layer in step S10. As a result, a processing time per cycle can be shortened and a total processing time can also be reduced. As such, it is possible to increase the film forming rate. In addition, if the thickness of the silicon-containing layer is set to be one atomic layer or less, it becomes possible to enhance the controllability of film thickness uniformity.

For the chlorosilane-based precursor gas, it may be possible to use not only the HCDS gas but also a tetrachlorosilane gas, i.e., a silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, a monochlorosilane ($SiH_3Cl$, abbreviation: MCS) gas, or the like. For the inert gas, it may be possible to use not only the $N_2$ gas but also a rare gas such as an Ar gas, a He gas, a Ne gas, a Xe gas, or the like.

[Step S11]

After the silicon-containing layer is formed on the wafer 200, the valve 243a of the first gas supply pipe 232a is closed to stop the supply of the HCDS gas. At this time, while the APC valve 244 of the exhaust pipe 231 is in an open state, the interior of the process chamber 201 is vacuum-exhausted by the vacuum pump 246 to remove the HCDS gas remaining in the process chamber 201, which has not reacted or remains after contributing to the formation of the silicon-containing layer, from the process chamber 201 (i.e., residual gas removal). In this case, the supply of the $N_2$ gas as the inert gas into the process chamber 201 is maintained by keeping the valves 243d, 243e, 243f, 243j, 243k, and 243l in an open state. The $N_2$ gas acts as a purge gas, which makes it possible to enhance the effect of removing from the process chamber 201 the HCDS gas remaining in the process chamber 201, which has not reacted or remains after contributing to the formation of the silicon-containing layer.

In this case, the residual gas within the process chamber 201 may not be completely removed and the interior of the process chamber 201 may not be completely purged. If the gas remaining within the process chamber 201 is very small in amount, following step S12 is not adversely affected by the residual gas. Here, an amount of the $N_2$ gas supplied into the process chamber 201 need not be a large amount. For example, if the amount of the supplied $N_2$ gas is substantially equal to a volume of the processing vessel (i.e., the process chamber 201), it is possible to perform the purge to such an extent as not to adversely affect step S12. As the interior of the process chamber 201 is not completely purged in this manner, it is possible to shorten the purge time and thus improve the throughput. It is also possible to reduce the consumption of the $N_2$ gas to a minimal necessity.

Similar to the case of supplying the HCDS gas, the temperature of the heater 207 is set such that the temperature of the wafers 200 falls within, for example, a range of 350 to 800 degree C., specifically, 450 to 800 degree C., more specifically, 550 to 750 degree C. Each flow rate of the $N_2$ gas as the purge gas supplied from the inert gas supply systems is set to fall within, for example, a range of 100 to 2,000 sccm. For the inert gas, it may be possible to use not only the N₂ gas but also a rare gas such as an Ar gas, a He gas, a Ne gas, a Xe gas, or the like.

[Step S12]

After the gas remaining within the process chamber 201 is removed, the valve 243g of the fourth gas supply pipe 232g is opened to allow the NH₃ gas to flow through the second gas supply pipe 232b. A flow rate of the NH₃ gas flowing from the fourth gas supply pipe 232g is adjusted by the mass flow controller 241g. The flow-rate-adjusted NH₃ gas is supplied from the gas supply holes 248b of the second nozzle 233b into the buffer chamber 237 maintained in a heated and depressurized state. Here, high-frequency electric power is applied between the first rod-shaped electrode 269 and the second rod-shaped electrode 270. Thus, the NH₃ gas supplied into the buffer chamber 237 is activated into plasma.

By applying the high-frequency electric power from the high-frequency power source 273 between the first rod-shaped electrode 269 and the second rod-shaped electrode 270 through the matching unit 272, the NH₃ gas supplied into the buffer chamber 237 is excited into plasma. The NH₃ gas is supplied as active species (or excited species) from the gas supply holes 248c into the process chamber 201 and exhausted through the exhaust pipe 231. As such, the plasma-excited NH₃ gas is supplied to the wafers 200 (i.e., NH₃ gas supply).

In this case, the valve 243j of the fourth inert gas supply pipe 232j may be opened so that a N₂ gas as an inert gas can be supplied from the fourth inert gas supply pipe 232j. A flow rate of the N₂ gas is adjusted by the mass flow controller 241j. The N₂ gas is supplied into the second gas supply pipe 232b. The flow-rate-adjusted N₂ gas is mixed with the flow-rate-adjusted NH₃ gas within the second gas supply pipe 232b. The N₂ gas is supplied from the gas supply holes 248b of the second nozzle 233b into the buffer chamber 237 kept in a heated and depressurized state and is then supplied from the gas supply holes 248c of the buffer chamber 237 into the process chamber 201 maintained in a heated and depressurized state. Then, the N₂ gas is exhausted through the exhaust pipe 231. In this operation, the valves 243d, 243e, 243f, 243k, and 243l are opened to allow the N₂ gas to flow through the first inert gas supply pipe 232d, the second inert gas supply pipe 232e, the third inert gas supply pipe 232f, the fifth inert gas supply pipe 232k, and the sixth inert gas supply pipe 232l in order to prevent the NH₃ gas from infiltrating into the first nozzle 233a, the second gas supply pipe 232b, and the third gas supply pipe 232c. The N₂ gas flowing through the first gas supply pipe 232a, the fifth gas supply pipe 232h, and the sixth gas supply pipe 232i is supplied into the process chamber 201 through the first nozzle 233a and exhausted through the exhaust pipe 231.

When the NH₃ gas is plasma-excited and thus allowed to flow as active species, the APC valve 244 is appropriately adjusted such that the internal pressure of the process chamber 201 falls within, for example, a range of 1 to 1,000 Pa. The flow rate of the NH₃ gas controlled by the mass flow controller 241g is set to fall within, for example, a range of 100 to 10,000 sccm. Each flow rate of the N₂ gas controlled by the mass flow controllers 241d, 241e, 241f, 241j, 241k, and 241l is set to fall within, for example, a range of 100 to 2,000 sccm. A time required for exposing the wafers 200 to the active species obtained by plasma-exciting the NH₃ gas, in other words, a gas supply time (i.e., a gas irradiation time) is set to fall within, for example, a range of 1 to 120 seconds. Taking the throughput into account, the temperature of the heater 207 may be set to be in a temperature range in which the silicon-containing layer is nitrided and which is the same range as employed during the supply of the HCDS gas in step S10, in other words, such that the internal temperatures of the process chamber 201 in steps S10 and S12 are maintained in the same temperature range. In this case, the temperature of the heater 207 may be set such that the temperature of the wafers 200 or the internal temperature of the process chamber 201 is kept constant within a range of 350 to 800 degree C., specifically, 450 to 800 degree C., more specifically, 550 to 750 degree C., in steps S10 and S12. The temperature of the heater 207 may be set such that the temperature of the process chamber 201 is kept in the same temperature range throughout steps S10 to S13 which will be described later. The high-frequency electric power applied from the high-frequency power source 273 between the first rod-shaped electrode 269 and the second rod-shaped electrode 270 is set to fall within, for example, a range of 10 to 100 W. In one example, the NH₃ gas may be supplied in a thermally excited state, i.e., in a thermally activated state. However, in order to obtain sufficient nitriding power in a case where a thermally activated NH₃ gas is supplied under a depressurized atmosphere, it may be necessary to set the internal pressure of the process chamber 201 to fall within a relatively high pressure range, for example, a range of 500 to 3,000 Pa, and set the temperature of the wafers 200 to be equal to or higher than 600 degree C. In contrast, in a case where the plasma-excited NH₃ gas is supplied, sufficient nitriding power can be obtained although the internal temperature of the process chamber 201 is set to the normal temperature. However, if the internal temperature of the process chamber 201 is set to become less than 200 degree C., reaction byproducts such as ammonium chloride (NH₄Cl) and the like adhere to an inner surface of the process chamber 201 or the wafers 200. Accordingly, it may be necessary to set the internal temperature of the process chamber 201 to be equal to or higher than 200 degree C. In the present embodiment, the internal temperature of the process chamber 201 may be set equal to 350 degree C.

By supplying the NH₃ gas into the process chamber 201 under the above described conditions, the plasma-excited NH₃ gas of active species reacts with at least a portion of the silicon-containing layer formed on the wafer 200 in step S10. Thus, nitriding is performed with respect to the silicon-containing layer. With the nitriding, the silicon-containing layer can be changed (i.e., modified) to a silicon nitride layer (e.g., Si₃N₄ layer, which may be referred to as a "SiN layer" hereinafter).

In this operation, the silicon-containing layer can be modified into a silicon-rich SiN layer by preventing the nitriding reaction of the silicon-containing layer from being saturated, in other words, by keeping the nitriding reaction of the silicon-containing layer unsaturated. In order to keep the nitriding reaction of the silicon-containing layer unsaturated, the nitriding power may need to be reduced by, for example, supplying the thermally-activated NH₃ gas rather than the plasma-activated NH₃ gas. The silicon-rich SiN layer refers to a SiN layer whose silicon ratio is higher than a silicon ratio in a SiN layer having a stoichiometric composition.

For the nitrogen-containing gas, it may be possible to use not only the NH₃ gas but also a diazene (N₂H₂) gas, a hydrazine (N₂H₄) gas, a N₃H₈ gas, or the like. For the inert gas, it may be possible to use not only the N₂ gas but also a rare gas such as an Ar gas, a He gas, a Ne gas, a Xe gas, or the like.

[Step S13]

Once the silicon-containing layer is modified into the SiN layer or the silicon-rich SiN layer, the valve 243g of the fourth gas supply pipe 232g is closed to stop the supply of the NH$_3$ gas. Here, while the APC valve 244 of the exhaust pipe 231 kept in an open state, the interior of the process chamber 201 is vacuum-exhausted by the vacuum pump 246 to remove the residual NH$_3$ gas or the reaction byproducts from the process chamber 201 (i.e., residual gas removal). In this case, the valves 243d, 243e, 243f, 243j, 243k, and 243l are in an open state, and the supply of the N$_2$ gas as an inert gas into the process chamber 201 is maintained. The N$_2$ gas acts as a purge gas which is capable of improving the effect of removing the NH$_3$ gas remaining in the process chamber 201, which has not reacted or which remains after contributing to the formation of the SiN layer or the silicon-rich SiN layer, and the reaction byproducts from the process chamber 201.

In this case, the residual gas within the process chamber 201 may not be completely removed and the interior of the process chamber 201 may not be completely purged. If the gas remaining within the process chamber 201 is very small in amount, following step S10 or S20 is not adversely affected by the residual gas. Here, an amount of the N$_2$ gas supplied into the process chamber 201 need not be a large amount. For example, if the amount of the supplied N$_2$ gas is substantially equal to a volume of the reaction tube 203 (i.e., the process chamber 201), it is possible to perform the purge to such an extent as not to adversely affect step S10 or S20. As the interior of the process chamber 201 is not completely purged in this manner, it is possible to shorten a purge time and thus improve the throughput. It is also possible to reduce the consumption of the N$_2$ gas to a minimal necessity.

Similar to the case of supplying the NH$_3$ gas, the temperature of the heater 207 is set such that the temperature of the wafers 200 falls within, for example, a range of 350 to 800 degree C., specifically, 450 to 800 degree C., more specifically, 550 to 750 degree C. Each flow rate of the N$_2$ gas as the purge gas supplied from the inert gas supply systems is set to fall within, for example, a range of 100 to 2,000 sccm. For the inert gas, it may be possible to use not only the N$_2$ gas but also a rare gas such as an Ar gas, a He gas, a Ne gas, a Xe gas, or the like.

A cycle including steps S10 to S13 as described above may be performed a predetermined number of times (e.g., m times) so that the SiN layer or the silicon-rich SiN layer having a thickness of several atomic layers, for example, greater than or equal to two atomic layers and less than or equal to six atomic layers, can be formed on the wafer 200.

<Process for Forming SiO Film>

Thereafter, a cycle including steps S20 to S23, which will be described below, is performed a predetermined number of times, for example, a plurality of times, so that a SiO film having a predetermined thickness is formed on the SiN layer or the silicon-rich SiN layer formed as the initial layer in steps S10 to S13 as described above.

[Step S20]

In step S20, the HCDS gas is supplied to the wafers 200 pursuant to the same sequence as used in step S10 (i.e., HCDS gas supply).

In this case, the APC valve 244 is appropriately adjusted such that the internal pressure of the process chamber 201 falls within, for example, a range of 1 to 13,300 Pa, specifically, 10 to 1,330 Pa. A flow rate of the HCDS gas controlled by the mass flow controller 241a is set to fall within, for example, a range of 1 to 1,000 sccm. Each flow rate of the N$_2$ gas controlled by the mass flow controllers 241d, 241e, 241f, 241j, 241k, and 241l is set to fall within, for example, a range of 100 to 2,000 sccm. A time during which the HCDS gas is supplied to the wafers 200, in other words, a gas supply time (i.e., a gas irradiation time) is set to fall within, for example, a range of 1 to 120 seconds. In this case, the temperature of the heater 207 is set such that the temperature of the wafers 200 falls within, for example, a range of 350 to 800 degree C., specifically, 450 to 800 degree C., more specifically, 550 to 750 degree C. If the temperature of the wafers 200 is less than 350 degree C., the HCDS gas is hardly decomposed and adsorbed to the wafers 200. This may sometimes make it impossible to obtain a practical film forming rate. By setting the temperature of the wafers 200 equal to or higher than 350 degree C., it is possible to solve the above problem and to obtain a sufficiently high film forming rate. If the temperature of the wafers 200 is set equal to or higher than 450 degree C., the effect of enhancing an oxidizing power in step S22, which will be described later, becomes significant. If the temperature of the wafers 200 is set equal to or higher than 550 degree C., it becomes possible to sufficiently decompose the HCDS gas. If the temperature of the wafers 200 exceeds 750 degree C., especially, 800 degree C., a CVD reaction becomes intensive (in other words, a gas phase reaction becomes predominant). Thus, the film thickness uniformity often gets worsened and becomes hard to control. By setting the temperature of the wafers 200 equal to or lower than 800 degree C., it becomes possible to restrain the film thickness uniformity from being worsened and to control the film thickness uniformity. In particular, if the temperature of the wafers 200 is set equal to or lower than 750 degree C., it becomes easy to secure and control uniformity of the film thickness. Accordingly, the temperature of the wafers 200 may be set to fall within a range of 350 to 800 degree C., specifically, 450 to 800 degree C., more specifically, 550 to 750 degree C.

By supplying the HCDS gas, a silicon-containing layer having a thickness, for example, from less than one atomic layer to several atomic layers is formed on the initial layer (i.e., the SiN layer or the silicon-rich SiN layer). The silicon-containing layer formed on the initial layer in step S20 is the same as the silicon-containing layer formed on the wafer 200 in step S10. If the thickness of the silicon-containing layer formed on the initial layer exceeds several atomic layers, the oxidizing (or modifying) action occurring in step S22, which will be described later, fails to affect the entire silicon-containing layer. In addition, the minimum value of the thickness of the silicon-containing layer that can be formed on the initial layer is less than one atomic layer. Accordingly, the thickness of the silicon-containing layer may be from less than one atomic layer to several atomic layers.

In addition, if the thickness of the silicon-containing layer is set to be one atomic layer or less, i.e., one atomic layer or less than one atomic layer, it is possible to relatively increase the effect of an oxidizing (or modifying) reaction in Step S22 which will be described later. This makes it possible to shorten a time required for the oxidizing reaction in step S22. It is also possible to shorten a time required in forming the silicon-containing layer in step S20. As a result, a processing time per cycle can be shortened and a total processing time can also be reduced. Thus, it becomes possible to increase the film forming rate. In addition, if the thickness of the silicon-containing layer is set to be one atomic layer or less, it becomes possible to easily control the film thickness uniformity.

[Step S21]

Once the silicon-containing layer is formed on the initial layer, the valve 243a of the first gas supply pipe 232a is closed to stop the supply of the HCDS gas. Here, while the APC valve 244 of the exhaust pipe 231 kept in an open state, the interior of the process chamber 201 is vacuum-exhausted by the vacuum pump 246 to remove the HCDS gas remaining in the process chamber 201, which has not reacted or remains after contributing to the formation of the silicon-containing layer, from the process chamber 201 (i.e., residual gas removal). In this case, the supply of the $N_2$ gas as an inert gas into the process chamber 201 is maintained by keeping the valves 243d, 243e, 243f, 243j, 243k, and 243l in an open state. The $N_2$ gas acts as a purge gas, which makes it possible to enhance the effect of removing from the process chamber 201 the HCDS gas remaining in the process chamber 201, which has not been reacted or remains after contributing to the formation of the silicon-containing layer.

In this case, the residual gas within the process chamber 201 may not be completely removed and the interior of the process chamber 201 may not be completely purged. If the gas remaining within the process chamber 201 is very small in amount, following step S22 is not adversely affected by the residual gas. Here, the amount of the $N_2$ gas supplied into the process chamber 201 need not be a large amount. For example, if the amount of the supplied $N_2$ gas is substantially equal to the volume of the processing vessel (i.e., the process chamber 201), it is possible to perform the purge to such an extent as not to adversely affect step S22. As the interior of the process chamber 201 is not completely purged in this manner, it is possible to shorten a purge time and thus improve the throughput. It is also possible to reduce the consumption of the $N_2$ gas to a minimal necessity.

Similar to the case of supplying the HCDS gas, the temperature of the heater 207 is set such that the temperature of the wafers 200 falls within, for example, a range of 350 to 800 degree C., specifically, 450 to 800 degree C., more specifically, 550 to 750 degree C. Each flow rate of the $N_2$ gas as the purge gas supplied from the inert gas supply systems is set to fall within, for example, a range of 100 to 2,000 sccm. For the inert gas, it may be possible to use not only the $N_2$ gas but also a rare gas such as an Ar gas, a He gas, a Ne gas, a Xe gas, or the like.

[Step S22]

Once the residual gas within the process chamber 201 is removed, the valve 243b of the second gas supply pipe 232b is opened to allow the $O_2$ gas to flow through the second gas supply pipe 232b. A flow rate of the $O_2$ gas flowing from the second gas supply pipe 232b is adjusted by the mass flow controller 241b. The flow-rate-adjusted $O_2$ gas is supplied via the second gas supply pipe 232b and the gas supply holes 248b of the second nozzle 233b into the buffer chamber 237 maintained in a heated and depressurized state. At the same time, the valve 243c of the third gas supply pipe 232c is opened to allow the $H_2$ gas to flow through the third gas supply pipe 232c. A flow rate of the $H_2$ gas flowing from the third gas supply pipe 232c is adjusted by the mass flow controller 241c. The flow-rate-adjusted $H_2$ gas is supplied via the second gas supply pipe 232b and the gas supply holes 248b of the second nozzle 233b into the buffer chamber 237 maintained in a heated and depressurized state. When going through the second gas supply pipe 232b, the $H_2$ gas is mixed with the $O_2$ gas within the second gas supply pipe 232b. Thus, the mixed gas of the $O_2$ gas and the $H_2$ gas is supplied from the second nozzle 233b. The mixed gas of the $O_2$ gas and the $H_2$ having been supplied into the buffer chamber 237 is supplied from the gas supply holes 248c of the buffer chamber 237 into the process chamber 201 maintained in a heated and depressurized state and is exhausted through the exhaust pipe 231. As such, the $O_2$ gas and the $H_2$ gas are supplied to the wafers 200 (i.e., supply of $O_2$ gas and $H_2$ gas).

Here, the valve 243e of the second inert gas supply pipe 232e may be opened so that the $N_2$ gas as an inert gas can be supplied from the second inert gas supply pipe 232e. A flow rate of the $N_2$ gas is adjusted by the mass flow controller 241e. The $N_2$ gas is supplied into the second gas supply pipe 232b. Moreover, the valve 243f of the third inert gas supply pipe 232f may be opened so that the $N_2$ gas as an inert gas can be supplied from the third inert gas supply pipe 232f. A flow rate of the $N_2$ gas is adjusted by the mass flow controller 241f. The $N_2$ gas is supplied into the third gas supply pipe 232c. In this case, a mixed gas of the $O_2$ gas, the $H_2$ gas, and the $N_2$ gas is supplied from the second nozzle 233b. The valves 243d, 243j, 243k and 243l are opened to allow the $N_2$ gas to flow through the first inert gas supply pipe 232d, the fourth inert gas supply pipe 232j, the fifth inert gas supply pipe 232k, and the sixth inert gas supply pipe 232l in order to prevent the $O_2$ gas and the $H_2$ from infiltrating into the first nozzle 233a and the fourth gas supply pipe 232g. The $N_2$ gas supplied into the first gas supply pipe 232a, the fifth gas supply pipe 232h, and the sixth gas supply pipe 232i is supplied into the process chamber 201 through the first nozzle 233a and exhausted through the exhaust pipe 231.

In this case, the APC valve 244 is appropriately adjusted such that the internal pressure of the process chamber 201 falls within, for example, a range of 1 to 1,000 Pa, which is lower than the atmospheric pressure. The flow rate of the $O_2$ gas controlled by the mass flow controller 241b is set to fall within, for example, a range of 1,000 to 10,000 sccm. The flow rate of the $H_2$ gas controlled by the mass flow controller 241c is set to fall within, for example, a range of 1,000 to 10,000 sccm. Each flow rate of the $N_2$ gas controlled by the mass flow controllers 241d, 241e, 241f, 241j, 241k, and 241l is set to fall within, for example, a range of 100 to 2,000 sccm. A time for supplying the $O_2$ gas and the $H_2$ gas to the wafers 200, in other words, a gas supply time (i.e., a gas irradiation time) is set to fall within, for example, a range of 1 to 120 seconds. The temperature of the heater 207 may be set to be in a temperature range in which the effect of enhancing the oxidizing power becomes significant, which will be described later, and which is the same range as used during the supply of the HCDS gas in step S20, for example, within a range of 450 to 800 degree C., specifically, 550 to 750 degree C. If the temperature of the wafers 200 is kept at the temperature of this range, the effect of enhancing the oxidizing power by the addition of the $H_2$ gas to the $O_2$ gas under a depressurized atmosphere becomes significant. If the temperature of the wafers 200 is too low, it is impossible to obtain the oxidizing power enhancing effect. Taking the throughput into account, the temperature of the heater 207 may be set such that the internal temperature of the process chamber 201 can be kept in the same temperature range throughout steps S20 to S22. The temperature of the heater 207 may also be set such that the internal temperature of the process chamber 201 can be kept in the same temperature zone throughout steps S20 to S23 which will be described later. In this case, the temperature of the heater 207 is set such that the internal temperature of the process chamber 201 can be kept constant within, for example, a range of 450 to 800 degree C., specifically, 550 to 750 degree C., throughout steps S20 to S23 which will be described later.

By supplying the $O_2$ gas and the $H_2$ gas into the process chamber 201 under the above described conditions, the $O_2$ gas and the $H_2$ gas are thermally activated in a non-plasma manner under a heated and depressurized atmosphere and are reacted with each other. Thus, oxidizing species is generated, such as atomic oxygen or the like, which contains oxygen but do not contain water ($H_2O$). The silicon-containing layer formed on the initial layer in step S20 is oxidized primarily by the oxidizing species. The energy of the oxidizing species is higher than the bonding energy of Si—N, Si—Cl, Si—H, and Si—C contained in the silicon-containing layer. By applying the energy of the oxidizing species to the silicon-containing layer, the Si—N, Si—Cl, Si—H, and Si—C bonds are broken. N, H, Cl, and C whose bond to Si is broken are removed from the film and are discharged as $N_2$, $H_2$, $Cl_2$, $HCl$, $CO_2$, and the like. The Si left due to the breakage of the bond with N, H, Cl, and C is bonded with 0 contained in the oxidizing species, thereby forming a Si—O bond. In this manner, the silicon-containing layer can be changed (i.e., modified) into a silicon oxide layer ($SiO_2$ layer, which will may be referred to as a "SiO layer" hereinafter) which may contain a low amount of impurities such as chlorine (Cl) and the like. With the above oxidizing process, it is possible to significantly increase the oxidizing power as compared with a case where the $O_2$ gas is supplied independently or a case where a water vapor ($H_2O$) is supplied. In other words, if the $H_2$ gas is added to the $O_2$ gas under a depressurized atmosphere, it is possible to obtain an effect of significantly increasing the oxidizing power as compared with a case where the $O_2$ gas is supplied independently or a case where a $H_2O$ gas is supplied.

In step S22, at least one or both of the $O_2$ gas and the $H_2$ gas may be activated by plasma. By activating the $O_2$ gas and/or the $H_2$ gas with plasma, it becomes possible to generate oxidizing species which contain active species of higher energy. If the oxidizing process is performed by the oxidizing species, it may be possible to obtain an effect of improving the device characteristic among others. For example, when both the $O_2$ gas and the $H_2$ gas are activated by plasma, high-frequency electric power is applied from the high-frequency power source 273 between the first rod-shaped electrode 269 and the second rod-shaped electrode 270 through the matching unit 272. Thus, a mixed gas of the $O_2$ gas and the $H_2$ gas supplied into the buffer chamber 237 is activated by plasma (i.e., plasma-excited) to become a gas containing active species, that is, a gas (i.e., oxidizing species) containing $O_2^*$ (i.e., active species of oxygen) or $H_2^*$ (i.e., active species of hydrogen), which is to be supplied from the gas supply holes 248c into the process chamber 201 and exhausted through the exhaust pipe 231. In this case, the high-frequency electric power applied from the high-frequency power source 273 between the first rod-shaped electrode 269 and the second rod-shaped electrode 270 is set to fall within, for example, a range of 50 to 1,000 W. Other processing conditions remain the same as the above described processing conditions. In addition, in the above described temperature range, the $O_2$ gas and the $H_2$ gas are activated by heat and are sufficiently reacted with each other. Thus, a sufficient amount of oxidizing species is generated, such as atomic oxygen or the like, which does not contain water ($H_2O$). Accordingly, sufficient oxidizing power can be obtained by thermally activating the $O_2$ gas and the $H_2$ gas in a non-plasma manner. If the thermally activated $O_2$ and $H_2$ gases are supplied, it is possible to generate a relatively soft reaction without causing any plasma damage. This makes it possible to perform the above described oxidizing process in a relatively soft manner.

For the oxygen-containing gas, i.e., the oxidizing gas, it may be possible to use not only the oxygen ($O_2$) gas but also the ozone ($O_3$) gas or the like. In the above described temperature range, a test was conducted to verify an effect obtained by adding a hydrogen-containing gas to a nitrogen monoxide (NO) gas or a nitorous oxide ($N_2O$) gas. Compared to the case of independently supplying the NO gas or the case of independently supplying the $N_2O$ gas, the case of supplying the NO gas or the $N_2O$ gas with the hydrogen-containing gas achieves the effect of enhancing the oxidizing power. In other words, it may be preferable to use a nitrogen-free oxygen-containing gas (which does not contain nitrogen but does contain oxygen) for the oxygen-containing gas. For the hydrogen-containing gas, i.e., the reducing gas, it may be possible to use not only the $H_2$ gas but also a deuterium ($D_2$) gas or the like. If an ammonia ($NH_3$) gas or a methane ($CH_4$) gas is used, nitrogen (N) impurity or a carbon (C) impurity may be mixed into the film. In other words, it may be preferable to use an other-element-free hydrogen-containing gas (which does not contain other elements but does contain hydrogen or deuterium) for the hydrogen-containing gas. That is to say, at least one gas selected from the group consisting of an $O_2$ gas and an $O_3$ gas can be used as the oxygen-containing gas. At least one gas selected from the group consisting of a $H_2$ gas and a $D_2$ gas can be used as the hydrogen-containing gas.

[Step S23]

After the silicon-containing layer formed in step S20 is changed into the SiO layer as described above, the valve 243b of the second gas supply pipe 232b is closed to stop the supply of the $O_2$ gas. Moreover, the valve 243c of the third gas supply pipe 232c is closed to stop the supply of the $H_2$ gas. Here, while the APC valve 244 of the exhaust pipe 231 is in an open state, the interior of the process chamber 201 is vacuum-exhausted by the vacuum pump 246 to remove the residual $O_2$ gas, the residual $H_2$ gas, and the reaction byproducts from the process chamber 201 (i.e., residual gas removal). The supply of the $N_2$ gas as an inert gas into the process chamber 201 is maintained by keeping the valves 243d, 243e, 243f, 243j, 243k, and 243l in an open state. The $N_2$ gas acts as the purge gas, which makes it possible to further enhance the effect of removing from the process chamber 201 the $O_2$ gas or the $H_2$ gas remaining in the process chamber 201, which has not reacted or remains after contributing to the formation of the SiO layer, and the reaction byproducts.

In this case, the residual gas within the process chamber 201 may not completely be removed and the interior of the process chamber 201 may not completely be purged. If the gas remaining within the process chamber 201 is very small in amount, following step S20 is not adversely affected by the residual gas. Here, an amount of the $N_2$ gas supplied into the process chamber 201 need not be a large amount. For example, if the amount of the $N_2$ gas is substantially equal to the volume of the reaction tube 203 (i.e., the process chamber 201), it is possible to perform the purge to such an extent as not to adversely affect step S20. As the interior of the process chamber 201 is not completely purged in this manner, it is possible to shorten a purge time and thus improve the throughput. It is also possible to reduce the consumption of the $N_2$ gas to a minimal necessity.

Similar to the case of supplying the $O_2$ gas and the $H_2$ gas, the temperature of the heater 207 is set such that the temperature of the wafers 200 falls within, for example, a range of 450 to 800 degree C., specifically, 550 to 750 degree C. Each flow rate of the $N_2$ gas as the purge gas supplied from the inert gas supply systems is set to fall within, for example, a range of 100 to 2,000 sccm. For the inert gas, it may be possible to use not only the $N_2$ gas but also a rare gas such as an Ar gas, a He gas, a Ne gas, a Xe gas, or the like.

A cycle including steps S20 to S23 as described above may be performed a predetermined number of times, specifically, a plurality of times (e.g., n times), so that a silicon oxide film (SiO film) having a predetermined thickness is formed on the initial layer (i.e., the SiN layer or the silicon-rich SiN layer). The SiN layer as the initial layer is modified into a SiO film or a SiON film by the oxidation during the formation of the SiO film. In addition, the SiN layer as the initial layer may be formed thick and then a portion of the SiN layer may be left as the SiN layer.

(Purge and Return to Atmospheric Pressure)

Once the SiO film having a predetermined thickness is formed on the initial layer (i.e., the SiN layer or the silicon-rich SiN layer), the valves 243d, 243e, 243f, 243j, 243k, and 243l are opened. Thus, the $N_2$ gas as an inert gas is supplied into the process chamber 201 from the first inert gas supply pipe 232d, the second inert gas supply pipe 232e, the third inert gas supply pipe 232f, the fourth inert gas supply pipe 232j, the fifth inert gas supply pipe 232k, and the sixth inert gas supply pipe 232l and exhausted through the exhaust pipe 231. The $N_2$ gas acts as a purge gas. Consequently, the interior of the process chamber 201 is purged by the inert gas, and the gas remaining within the process chamber 201 is removed from the interior of the process chamber 201 (i.e., purge). Subsequently, the internal atmosphere of the process chamber 201 is substituted with the inert gas, and the internal pressure of the process chamber 201 is returned to the normal pressure (i.e., return to atmospheric pressure).

(Boat Unloading and Wafer Discharging)

Thereafter, the seal cap 219 is lowered by the boat elevator 115 to open the lower end portion of the manifold 209. The processed wafers 200 supported by the boat 217 are unloaded from the lower end portion of the manifold 209 to the outside of the reaction tube 203 (i.e., boat unloading). After the boat unloading, the shutter 219s is moved by the shutter opening/closing mechanism 115s so that the lower end opening of the manifold 209 is sealed by the shutter 219s through the O-ring 220c (i.e., shutter closing). Then, the processed wafers 200 are taken out from the boat 217 (i.e., wafer discharging).

(3) Effects According to the Embodiment

According to the present embodiment, one or more effects may be achieved as described below.

By forming the initial layer having a thickness of several atomic layers on the wafer and forming the oxide film on the initial layer, it becomes possible to suppress oxidation of the base film on the substrate surface during the formation of the oxide film.

The following can be taken as examples of the effects provided by forming the initial layer having a thickness of several atomic layers, specifically, the initial layer having a thickness greater than or equal to two atomic layers and less than or equal to six atomic layers, on the wafer.

If the thickness of the initial layer is one atomic layer or less, it is not possible for the initial layer to sufficiently obtain the effect of suppressing oxidation of the base film during the formation of the silicon oxide film (i.e., SiO film). In other words, the initial layer cannot sufficiently serve as an oxidation-preventing layer (or an oxidation blocking layer). By setting the thickness of the initial layer to be of two atomic layers or more, it is possible to allow the initial layer to sufficiently serve as an oxidation-preventing layer.

If the thickness of the initial layer exceeds six atomic layers, the initial layer may affect the properties of the SiO film formed thereon. In other words, the properties of the SiO film are often influenced by the properties of the initial layer. For example, the dielectric constant of SiN is higher than the dielectric constant of SiO. If a SiN layer having a thickness greater than six atomic layers is formed as the initial layer, the dielectric constant of the SiO film and the SiN film as a whole may be increased and the desired dielectric constant may not be obtained. In addition, for example, the film stress of SiN differs from the film stress of SiO. Therefore, if the SiN layer having a thickness greater than six atomic layers is formed as the initial layer, the film stress of the SiN layer often affects the film stress of the SiO film. As such, by setting the thickness of the initial layer equal to six atomic layers or less, it is possible to significantly reduce the influence of the initial layer on the properties of the SiO film.

In the present embodiment, the entire initial layer may be changed into SiO during the formation of the SiO film. If the initial layer is formed to have a thickness greater than six atomic layers, it is difficult to change the entire initial layer into SiO. By setting the thickness of the initial layer equal to six atomic layers or less, it becomes possible to change the entire initial layer into SiO. If the thickness of the initial layer is set equal to six atomic layers or less, it becomes easy to control changing the entire initial layer into SiO during the formation of the SiO film, changing the initial layer into SiON during the formation of the SiO film, or changing a portion of the initial layer into SiO during the formation of the SiO film without changing a portion of the initial layer (e.g., the SiN layer) into SiO. In other words, if the thickness of the initial layer is set equal to six atomic layers or less, it becomes easy to control (or tune) the initial layer into a desired state. It also becomes possible to diversify the control of the state of the initial layer.

For the reasons described above, it may be preferred that the thickness of the initial layer is set greater than or equal to two atomic layers and less than or equal to six atomic layers, in other words, several atomic layers.

One atomic layer of the initial layer is approximately 1 to 1.5 Å (0.1 to 0.15 nm) thick. Therefore, two atomic layers are about 2 to 3 Å (0.2 to 0.3 nm) thick and six atomic layers are about 6 to 9 Å (0.6 to 0.9 nm) thick. In other words, the thickness greater than or equal to two atomic layers and less than or equal to six atomic layers (i.e., several atomic layers) is approximately 2 to 9 Å (i.e., 0.2 to 0.9 nm) thick. That is to say, it may be preferred that the thickness of the initial layer is 2 Å (0.2 nm) or more and 9 Å (0.9 nm) or less thick.

The following can be taken as examples of the effects provided by forming a silicon-rich SiN layer as the initial layer.

The stoichiometric composition of SiN can be represented by Si/N=3/4, and the composition of silicon-rich SiN can be expressed by Si/N>3/4.

As such, in the silicon-rich SiN layer, the percentage of silicon in the SiN layer is larger than the percentage of silicon in the SiN layer of a stoichiometric composition. Thus, if the silicon-rich SiN layer is formed as the initial layer, it becomes easy for the initial layer to absorb oxygen. The SiN layer of a stoichiometric composition serves primarily as an oxidation blocking layer. In contrast, the silicon-rich SiN layer serves not only as an oxidation blocking layer but also as an oxygen absorption layer. The silicon-rich SiN layer can absorb oxygen diffused into a device in the subsequent steps. The silicon-rich SiN layer differs in film stress and barrier property from the SiN layer of a stoichiometric composition. It is therefore possible to expand the choices in case where the initial layer is not entirely oxidized and at least a portion of the initial layer is left as it is.

(4) Additional Embodiments of the Present Disclosure

In the above described sequence shown in FIGS. 4 and 5, descriptions have been made on an example in which the HCDS gas and the $NH_3$ gas are alternately supplied a predetermined number of times (e.g., m times) to form the SiN layer or the silicon-rich SiN layer as the initial layer on the wafer and form the SiO film on the initial layer. However, the present disclosure is not limited thereto. As will be described later, a predetermined-element-containing layer, for example, a silicon-containing layer such as a layer composed of silicon (i.e., a Si layer) or a silicon oxynitride layer (i.e., a SiON layer), may be formed as the initial layer.

Second Embodiment

Figure 6:
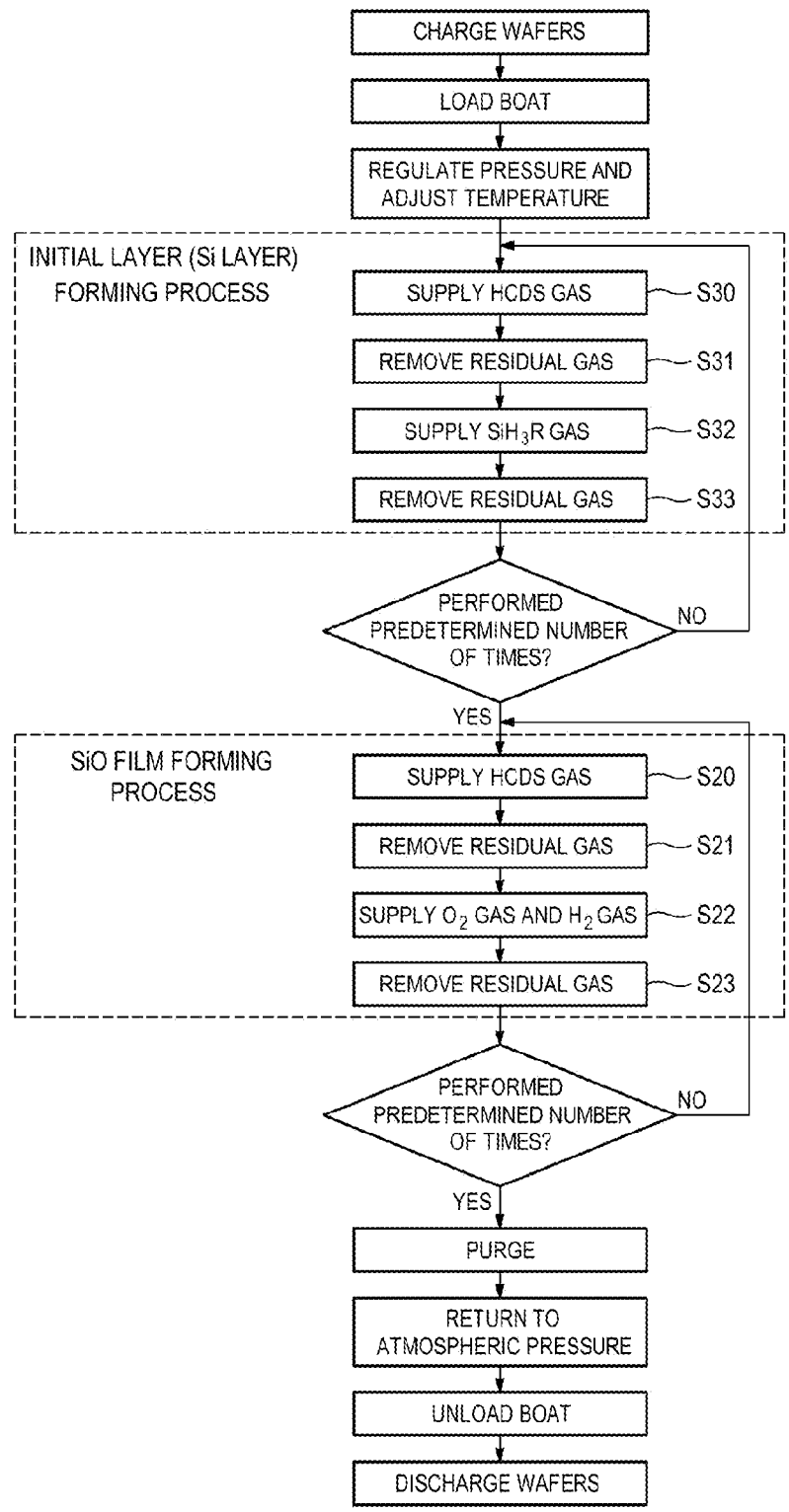
FIG. 6 illustrates a flowchart of processing according to a second embodiment of the present disclosure.
Figure 7:
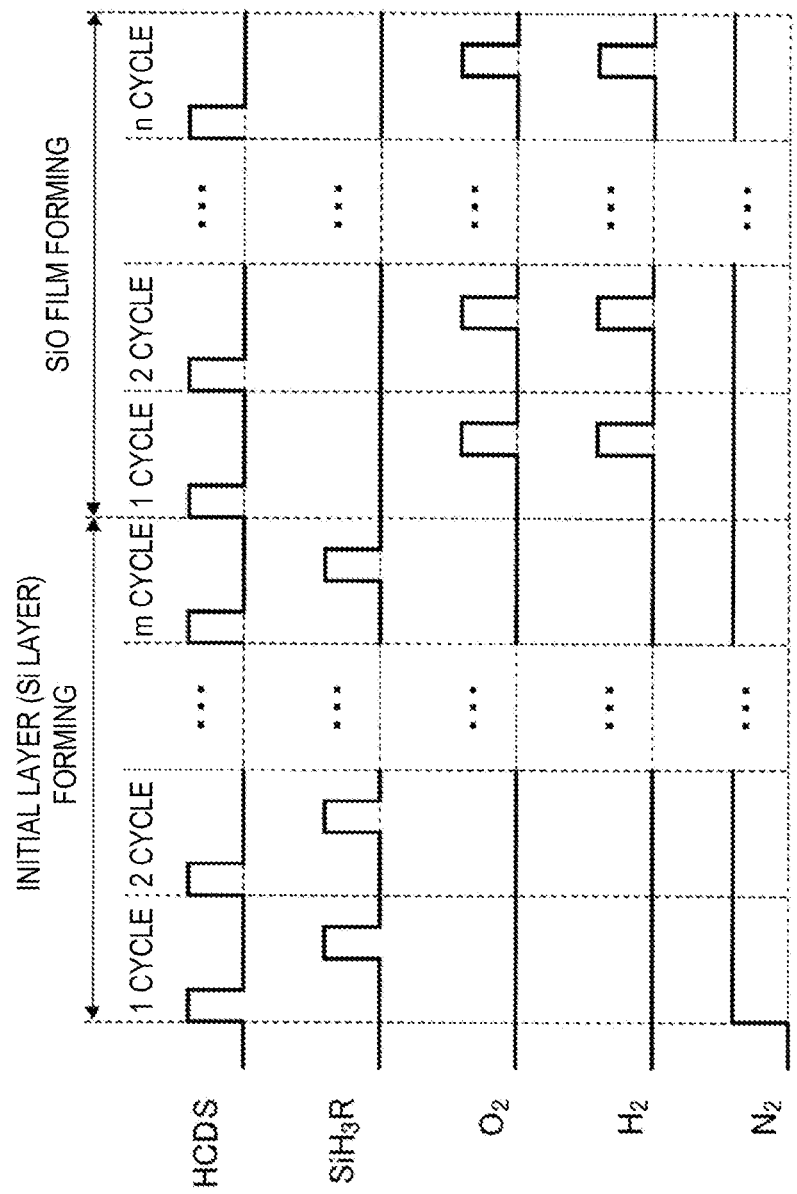
FIG. 7 illustrates gas supply timings in a film forming sequence according to the second embodiment of the present disclosure.

In a second embodiment, an HCDS gas as a chlorosilane-based precursor gas and a monoaminosilane gas (a $SiH_3R$ gas) as an aminosilane-based precursor gas are alternately supplied a predetermined number of times to form a silicon layer (i.e., a Si layer) as the initial layer on a wafer and form the silicon oxide film on the initial layer. Differences from the first embodiment will now be described with reference to FIGS. 6 and 7. FIG. 6 illustrates a flowchart of processing according to the second embodiment. FIG. 7 illustrates gas supply timings in a film forming sequence according to the second embodiment. The substrate processing according to the present embodiment is performed in the processing furnace 202 of the substrate processing apparatus shown in FIGS. 1 and 2. The operations of the respective parts constituting the substrate processing apparatus are controlled by the controller 121.

Wafer charging, boat loading, pressure regulating, and temperature adjusting steps are performed through the same procedures as those of the respective steps of the above described embodiment.

Next, the Si layer forming process is performed in which an HCDS gas and the $SiH_3R$ gas are supplied into the process chamber 201 to form the Si layer as the initial layer on the wafer 200. In the Si layer forming process, four steps (steps S30 to S33) to be described below are sequentially performed.

<Process for Forming Initial Layer (Si Layer)>

[Step S30]

In step S30, the HCDS gas is supplied to the wafer 200 through the same procedure as that of step S10 of the film forming sequence shown in FIGS. 4 and 5 (i.e., HCDS gas supply).

Here, the APC valve 244 is appropriately adjusted such that the internal pressure of the process chamber 201 falls within, for example, a range of 1 to 13,300 Pa, specifically, 20 to 1,330 Pa. A flow rate of the HCDS gas controlled by the mass flow controller 241a is set to fall within, for example, a range of 1 to 1,000 sccm. Each flow rate of the $N_2$ gas controlled by the mass flow controllers 241d, 241e, 241f, 241j, 241k, and 241l is set to fall within, for example, a range of 100 to 2,000 sccm. A time during which the HCDS gas is supplied to the wafers 200, in other words, a gas supply time (i.e., gas irradiation time) is set to fall within, for example, a range of 1 to 120 seconds, specifically, 1 to 60 seconds.

Here, if the temperature of the wafers 200 is less than 250 degree C., it is hard for the HCDS gas to be chemically adsorbed to the wafers 200. This may sometimes make it impossible to obtain a practical film forming rate. By setting the temperature of the wafers 200 equal to or higher than 250 degree C., it is possible to solve the above problem. If the temperature of the wafers 200 is set equal to or higher than 300 degree C. and, furthermore, equal to or higher than 350 degree C., HCDS can be sufficiently absorbed to the wafers 200. Thus, a sufficient film forming rate is obtained. If the temperature of the wafers 200 exceeds 750 degree C., especially, 800 degree C., a CVD reaction becomes intensive (i.e., a gas phase reaction becomes predominant). Thus, the film thickness uniformity often gets worsened and becomes hard to control. By setting the temperature of the wafers 200 equal to or lower than 800 degree C., especially, 750 degree C., it becomes possible to restrain the film thickness uniformity from being worsened and to control the film thickness uniformity. In particular, if the temperature of the wafers 200 is set equal to or lower than 650 degree C. and, furthermore, equal to or lower than 600 degree C., a surface reaction becomes predominant. This makes it easy to secure and control the film thickness uniformity. In this manner, if the temperature of the wafers 200 is set to fall within, for example, a range of 250 to 800 degree C., specifically, 300 to 650 degree C., more specifically, 350 to 600 degree C., it is possible to allow the processing in step S30 (i.e., the formation of a first layer which will be described later) to be performed.

As will be described in detail later, if the temperature of the wafers 200 is less than 300 degree C., it is hard to perform a modifying reaction (i.e., a modifying reaction of a first layer) ahead in step S32. By setting the temperature of the wafers 200 equal to or higher than 300 degree C., it becomes easy to perform the modifying reaction of step S32. If the temperature of the wafers 200 is set equal to or higher than 350 degree C., the modifying reaction of step S32 becomes more active. If the temperature of the wafers 200 exceeds 450 degree C., it becomes difficult to perform the modifying reaction of step S32 appropriately. As such, in order to efficiently and appropriately perform the processing of step S32, the temperature of the wafers 200 needs to be set to fall within, for example, a range of 300 to 450 degree C., specifically, 350 to 450 degree C.

As described above, suitable temperature conditions for step S30 are different from those for step S32, which will be described later. The temperature range suitable for performing step S32 is included in the temperature range suitable for performing step S30. In order to improve the throughput of the silicon layer forming process in which a cycle including steps S30 and S32 is performed a predetermined number of times, it may be preferred that the wafers 200 are kept under the same temperature condition in steps S30 to S33. That is to say, it may be preferred that the temperature condition of the wafers 200 in step S30 is the same as the temperature condition of the wafers 200 in step S32. Accordingly, it may be desirable that, in step S30, the temperature of the wafers 200 is set to fall within, for example, a range of 300 to 450 degree C., specifically, 350 to 450 degree C. In this temperature range, the processing in step S30 (i.e., formation of the first layer) and the modifying in step S32 (i.e., modifying of the first layer) can be efficiently and appropriately performed.

By supplying the HCDS gas to the wafer 200 under the above described conditions, the first layer, e.g., a silicon-containing layer containing chlorine (Cl) having a thickness of less than one atomic layer to several atomic layers, is formed on the wafer 200 (e.g., on the base film of the surface of the wafer 200).

[Step S31]

Once the silicon-containing layer containing Cl is formed, the valve 243a of the first gas supply pipe 232a is closed to stop the supply of the HCDS gas. Here, while the APC valve 244 of the exhaust pipe 231 is in an open state, the interior of the process chamber 201 is vacuum-exhausted by the vacuum pump 246 to remove the HCDS gas remaining in the process chamber 201, which has not reacted or remains after contributing to the formation of the first layer, from the process chamber 201 (i.e., residual gas removal). In this case, the supply of the $N_2$ gas as an inert gas into the process chamber 201 is maintained by keeping the valves 243d, 243e, 243f, 243j, 243k, and 243l in an open state. The $N_2$ gas acts as a purge gas, which makes it possible to enhance the effect of removing from the process chamber 201 the HCDS gas remaining in the process chamber 201, which has not reacted or remains after contributing to the formation of the first layer. At this time, similar to the first embodiment, it may be possible not to completely purge the interior of the process chamber 201.

[Step S32]

Once the residual gas within the process chamber 201 is removed, the valve 243h of the fifth gas supply pipe 232h is opened to allow the $SiH_3R$ gas to flow through the fifth gas supply pipe 232h. A flow rate of the $SiH_3R$ gas flowing through the fifth gas supply pipe 232h is adjusted by the mass flow controller 241h. The flow-rate-adjusted $SiH_3R$ gas is supplied from the gas supply holes 248a of the first nozzle 233a into the process chamber 201 and exhausted through the exhaust pipe 231. As such, the $SiH_3R$ gas is supplied to the wafers 200. At the same time, the valve 243k is opened to allow the $N_2$ gas as an inert gas to flow through the fifth inert gas supply pipe 232k. A flow rate of the $N_2$ gas flowing through the fifth inert gas supply pipe 232k is adjusted by the mass flow controller 241k. The flow-rate-adjusted $N_2$ gas and the $SiH_3R$ gas are supplied into the process chamber 201 and exhausted through the exhaust pipe 231. In this operation, the valves 243d, 243e, 243f, 243j, and 243l are opened to allow the $N_2$ gas to flow through the first inert gas supply pipe 232d, the second inert gas supply pipe 232e, the third inert gas supply pipe 232f, the fourth inert gas supply pipe 232j, and the sixth inert gas supply pipe 232l in order to prevent the $SiH_3R$ gas from infiltrating into the second nozzle 233b, the buffer chamber 237, the first gas supply pipe 232a, and the sixth gas supply pipe 232i. The $N_2$ gas having been supplied into the second gas supply pipe 232b, the third gas supply pipe 232c, and the fourth gas supply pipe 232g is supplied into the process chamber 201 through the second nozzle 233b and the buffer chamber 237 and exhausted through the exhaust pipe 231 (i.e., $SiH_3R$ gas supply).

In this case, the APC valve 244 is appropriately adjusted such that the internal pressure of the process chamber 201 falls within, for example, a range of 1 to 13,300 Pa, specifically, 20 to 1,330 Pa. The flow rate of the $SiH_3R$ gas controlled by the mass flow controller 241b is set to fall within, for example, a range of 1 to 1,000 sccm. Each flow rate of the $N_2$ gas controlled by the mass flow controllers 241d, 241e, 241f, 241j, 241k, and 241l is set to fall within, for example, a range of 100 to 2,000 sccm. A time during which the $SiH_3R$ gas is supplied to the wafers 200, in other words, a gas supply time (i.e., gas irradiation time), is set to fall within, for example, a range of 1 to 120 seconds, specifically, 1 to 60 seconds.

Similar to step S30, the temperature of the heater 207 is set such that the temperature of the wafers 200 falls within, for example, a range of 300 to 450 degree C., specifically, 350 to 450 degree C.

If the temperature of the wafers 200 is less than 300 degree C., the $SiH_3R$ gas supplied to the wafers 200 is hardly autolyzed (or pyrolyzed) and a ligand (R) including the amino group is hardly separated from silicon in the $SiH_3R$ gas. That is to say, the number of ligands (R) reacting with the first layer formed in step S30 (i.e., the silicon-containing layer which contains Cl) may be insufficient. As a result, a separation reaction in which Cl is separated from the first layer is hard to occur.

By setting the temperature of the wafers 200 equal to or higher than 300 degree C., the $SiH_3R$ gas supplied to the wafers 200 is easily pyrolyzed and the ligand (R) including the amino group is easily separated from silicon of the $SiH_3R$ gas. The separated ligand (R) reacts with a halogen group (Cl) in the first layer. Thus, the separation reaction in which Cl is separated from the first layer becomes easy to occur. By setting the temperature of the wafers 200 equal to or higher than 350 degree C., the pyrolysis of the $SiH_3R$ gas supplied to the wafers 200 may become more active, and the number of ligands (R) separated from silicon of the $SiH_3R$ gas may increase. Due to the increase in the number of ligands (R) reacting with Cl in the first layer, the separation reaction in which Cl is separated from the first layer becomes more active.

Heat energy exceeding 450 degree C. is needed in order that the ligand (R) including the amino group separated from silicon of the $SiH_3R$ gas can be bonded to silicon in the first layer (i.e., the Cl-desorbed silicon-containing layer), specifically, silicon which has a dangling bond generated due to the separation of Cl from the first layer (i.e., newly unpaired silicon) or silicon which previously had a dangling bond (i.e., originally unpaired silicon). Therefore, by setting the temperature of the wafers 200 equal to or less than 450 degree C., the ligand (R) including the amino group separated from silicon of the $SiH_3R$ gas can be prevented from being bonded to the newly unpaired silicon or the originally unpaired silicon in the first layer (i.e., the Cl-desorbed silicon-containing layer). In other words, by setting the temperature of the wafers 200 equal to or less than 450 degree C., the ligand (R) including the amino group can be prevented from being introduced into the first layer (i.e., the Cl-desorbed silicon-containing layer). As a result, the content of impurities such as carbon (C) and nitrogen (N) existing in a modified first layer, i.e., a second layer to be described later, can be kept very small.

By keeping the temperature of the wafers 200 in the above described temperature range (i.e., the temperature range of 300 to 450 degree C.), the ligand (R)-separated silicon of the $SiH_3R$ gas, that is, the silicon having a dangling bond which has contained in the $SiH_3R$ gas (i.e., newly unpaired silicon), can be bonded to the newly unpaired silicon or the originally unpaired silicon in the first layer (i.e., the Cl-desorbed silicon-containing layer) to form a Si—Si bond.

If the temperature of the wafers 200 exceeds 450 degree C., the ligand (R) including the amino group separated from the silicon of the $SiH_3R$ gas can be easily bonded to the newly unpaired silicon or the originally unpaired silicon in the first layer (i.e., the Cl-desorbed silicon-containing layer). In other words, the ligand (R) including the amino group can be easily introduced into the first layer (i.e., the Cl-desorbed silicon-containing layer). In addition, the content of impurities such as carbon (C) and nitrogen (N) existing in a modified first layer, i.e., a second layer which will be described later, can be easily increased.

Accordingly, it may be desirable that the temperature of the wafers 200 is set to fall within, for example, a range of 300 to 450 degree C., specifically, 350 to 450 degree C.

By supplying the $SiH_3R$ gas to the wafers 200 under the above described conditions, the first layer (i.e., the silicon-containing layer which contains Cl) formed on the wafer 200 in step S30 reacts with the $SiH_3R$ gas. In other words, if the $SiH_3R$ gas is supplied to the wafers 200 heated to the above described temperature, the ligand (R) including the amino group is separated from the silicon of the $SiH_3R$ gas. The separated ligand (R) reacts with Cl in the first layer and thus, Cl is separated from the first layer. By heating the wafers 200 to the above described temperature, the ligand (R) including the amino group separated from silicon of the $SiH_3R$ gas is prevented from being bonded to the newly unpaired silicon or the originally unpaired silicon in the first layer (i.e., the Cl-desorbed silicon-containing layer). The ligand (R)-separated unpaired silicon of the $SiH_3R$ gas is bonded to the newly unpaired silicon or the originally unpaired silicon of the first layer (i.e., the Cl-desorbed silicon-containing layer), thus forming a Si—Si bond. Consequently, the first layer (i.e., the silicon-containing layer which contains Cl) formed on the wafer 200 in step S30 is changed (i.e., modified) into a second layer which contains silicon and which has a very small amount in the content of impurities such as chlorine (Cl), carbon (C), and nitrogen (N). The second layer is a layer having a thickness of less than one atomic layer to several atomic layers. The second layer becomes a silicon layer (Si layer) which is a layer composed of silicon having a very small amount in the content of impurities such as chlorine (Cl), carbon (C), and nitrogen (N). The crystalline structure of the Si layer is amorphous. Therefore, the Si layer may be referred to as an amorphous silicon layer (i.e., a-Si layer).

When forming the Si layer as the second layer, Cl previously contained in the non-modified first layer reacts, for its most part, with the ligand (R) including the amino group previously contained in the $SiH_3R$ gas in the course of a reaction in which the first layer is modified by the $SiH_3R$ gas. Thus, gaseous reaction products, e.g., amino salts, are generated and discharged from the process chamber 201 through the exhaust pipe 231. This makes it possible to reduce the amount of impurities such as Cl, C, and N contained in the modified first layer, i.e., the second layer. If the $SiH_3R$ gas is used as the aminosilane-based precursor gas, it becomes easy to reduce the amount of impurities such as C and N contained in the modified first layer, i.e., the second layer. In particular, it is possible to significantly reduce the amount of N. This is because the number of amino groups included in the composition (e.g., one molecule) of the $SiH_3R$ gas is small, in other words, because the amount of C and N contained in the composition of the $SiH_3R$ gas is small.

[Step S33]

Once the Si layer is formed, the valve 243g of the fourth gas supply pipe 232g is closed to stop the supply of the $SiH_3R$ gas. Here, while the APC valve 244 of the exhaust pipe 231 is in an open state, the interior of the process chamber 201 is vacuum-exhausted by the vacuum pump 246 to remove the $SiH_3R$ gas remaining in the process chamber 201, which has not reacted or remains after contributing to the formation of the second layer, and the reaction byproducts from the process chamber 201 (i.e., residual gas removal). In this case, the supply of the $N_2$ gas as an inert gas into the process chamber 201 is maintained by keeping the valves 243d, 243e, 243f, 243j, 243k, and 243l in an open state. The $N_2$ gas acts as a purge gas, which makes it possible to enhance the effect of removing from the process chamber 201 the $SiH_3R$ gas remaining in the process chamber 201, which has not reacted or remains after contributing to the formation of the second layer, and the reaction byproducts. Similar to the first embodiment, the interior of the process chamber 201 may not be completely purged.

For the aminosilane-based precursor, it may be possible to use not only the monoaminosilane ($SiH_3R$) but also an organic precursor such as diaminosilane ($SiH_2RR'$), triaminosilane ($SiH_2RR'R''$), tetraminosilane ($SiH_2RR'R''R'''$), and the like. In this regard, each of R, R', R'', and R''' indicates a ligand, specifically, an amino group in which one or two hydrocarbon groups containing one or more carbon atoms (C) are coordinated in one nitrogen atom (N) (i.e., an amino group represented as $NH_2$ whose one or both of H atoms are substituted with a hydrocarbon group(s) containing one or more carbon atoms (C)). In a case where two hydrocarbon groups constituting a part of the amino group are coordinated in one nitrogen atom, the two hydrocarbon groups may be identical with each other or may be different from each other. The hydrocarbon groups may include unsaturated bonds such as double bonds or triple bonds. The amino groups R, R', R'', and R''' may be identical with one another or may be different from one another. The amino groups may have an annular structure. For example, for the $SiH_3R$, it may be possible to use (ethylmethylamino)silane ($SiH_3[N(CH_3)(C_2H_5)]$), (dimethylamino)silane ($SiH_3[N(CH_3)_2]$), (diethylpiperidino)silane ($SiH_3[NC_5H_8(C_2H_5)_2]$), and the like. For example, for the $SiH_3RR'$, it may be possible to use bis(diethylamino)silane ($SiH_2[N(C_2H_5)_2]_2$, abbreviation: BDEAS), bis(tert-butylamino)silane ($SiH_2[NH(C_4H_9)]_2$, abbreviation: BTBAS), bis(diethylpiperidino)silane ($SiH_2[NC_5H_8(C_2H_5)_2]_2$, abbreviation: BDEPS), and the like. For example, for the $SiH_3RR'R''$, it may be possible to use tris(diethylamino)silane ($SiH[N(C_2H_5)_2]_3$, abbreviation: 3DEAS), tris(dimethylamino)silane ($SiH[N(CH_3)_2]_3$, abbreviation: 3DMAS), and the like. For example, for the $SiH_3RR'R''R'''$, it may be possible to use tetrakis(diethylamino)silane ($Si[N(C_2H_5)_2]_4$, abbreviation: 4DEAS), tetrakis(dimethylamino)silane ($Si[N(CH_3)_2]_4$, abbreviation: 4DMAS), or the like.

It may be preferable to use, for the aminosilane-based precursor, an organic precursor in which the number of ligands including amino groups in the composition formula thereof is equal to or less than two and equal to or less than the number of ligands including halogen groups in the composition formula of the chlorosilane-based precursor.

For example, if $HCDS(Si_2Cl_6)$, $STC(SiCl_4)$, $TCS(SiHCl_3)$, or $DCS(SiH_2Cl_2)$, in which the number of ligands (Cl) including halogen groups in the composition formula thereof is equal to or larger than two, is used as the chlorosilane-based precursor, it may be preferable to use, as the aminosilane-based precursor, not only monoaminosilane ($SiH_3R$) in which the number of ligands (R) including amino groups in the composition formula thereof is one but also diaminosilane ($SiH_2RR'$) in which the number of ligands (R) including amino groups in the composition formula thereof is two. If MCS (i.e., $SiH_3Cl$) in which the number of ligands (CO including halogen groups in the composition formula thereof is one is used as the chlorosilane-based precursor, it is preferable to use, as the aminosilane-based precursor, monoaminosilane ($SiH_3R$) in which the number of ligands (R) including amino groups in the composition formula thereof is one.

It may be preferred that the number of ligands (R) including amino groups in the composition formula of the aminosilane-based precursor is smaller than the number of ligands (Cl) including halogen groups in the composition formula of the chlorosilane-based precursor. Accordingly, if DCS, in which the number of ligands (Cl) including halogen groups in the composition formula thereof is two, is used as the chlorosilane-based precursor, it is preferable to use, as the aminosilane-based precursor, monoaminosilane in which the number of ligands (R) including amino groups in the composition formula thereof is one rather than diaminosilane in which the number of ligands (R) including amino groups in the composition formula thereof is two.

It may be more preferable that the number of ligands (R) including amino groups in the composition formula of the aminosilane-based precursor is one. Accordingly, it is more preferable to use, as the aminosilane-based precursor, monoaminosilane rather than diaminosilane. In this case, in order to make sure that the number of ligands (R) including amino groups in the composition formula of the aminosilane-based precursor becomes smaller than the number of ligands (Cl) including halogen groups in the composition formula of the chlorosilane-based precursor, it is more preferable to use, as chlorosilane-based precursor, HCDS, STC, TCS, or DCS, in which the number of ligands (Cl) including halogen groups in the composition formula thereof is equal to or larger than two.

By doing as above, Cl contained in the non-modified first layer (i.e., the silicon-containing layer which contains Cl) exists in a larger number than the ligands (R) including amino groups contained in the $SiH_3R$ gas supplied to the first layer (i.e., the silicon-containing layer which contains Cl) in step S32. In this case, the ligands (R) including amino groups previously contained in the $SiH_3R$ gas react, for most part, with Cl contained in the non-modified first layer (i.e., Cl which exists in a larger amount than the ligands (R) including amino groups) in the course of the modifying reaction of the first layer. Thus, gaseous reaction products, for example, amino salts, are generated and discharged from the process chamber 201 through the exhaust pipe 231. In other words, the ligands (R) including amino groups previously contained in the $SiH_3R$ gas are not introduced into the modified first layer, i.e., the second layer. Most of the ligands (R) including amino groups are discharged from the process chamber 201 and are extinguished. As a result, the modified first layer, i.e., the second layer, can be changed (i.e., modified) to a silicon layer in which the amount of impurities such C and N is further reduced.

For the inert gas, it may be possible to use not only the $N_2$ gas but also a rare gas such as an Ar gas, a He gas, a Ne gas, a Xe gas, or the like.

(Performing Steps Predetermined Number of Times)

A cycle including steps S30 to S33 is performed a predetermined number of times (e.g., m times) to form on the wafer 200 the initial layer (i.e., a silicon layer or a Si layer) which has a thickness of several atomic layers, specifically, greater than or equal to two atomic layers and less than and equal to six atomic layers and is a layer composed of silicon having a very small amount of impurities such as chlorine (Cl), carbon (C), and nitrogen (N). The crystalline structure of the Si layer is amorphous. Therefore, the Si layer may be referred to as an amorphous silicon layer (a-Si layer). By repeating the cycle a predetermined number of times, the Si layer having a thickness of several atomic layers can be formed with increased wafer-surface thickness uniformity and high controllability.

(Process for Forming SiO Film)

Thereafter, a SiO film is formed through the same procedures as the processes for forming the SiO film according to the first embodiment. In other words, a cycle including steps S20 to S23 which are identical with steps S20 to S23 of the film forming sequence shown in FIGS. 4 and 5 is performed a predetermined number of times, specifically, a plurality of times (e.g., n times), which makes it possible to form the SiO film having a predetermined thickness on the initial layer (i.e., the Si layer). In addition, the Si layer as the initial layer is modified into a SiO film by the oxidation that occurs during the formation of the SiO film.

Thereafter, purging, returning-to-atmospheric-pressure, boat unloading, and wafer discharging steps are performed through the same procedures as those of the respective steps of the above described first embodiment.

Third Embodiment

Figure 8:
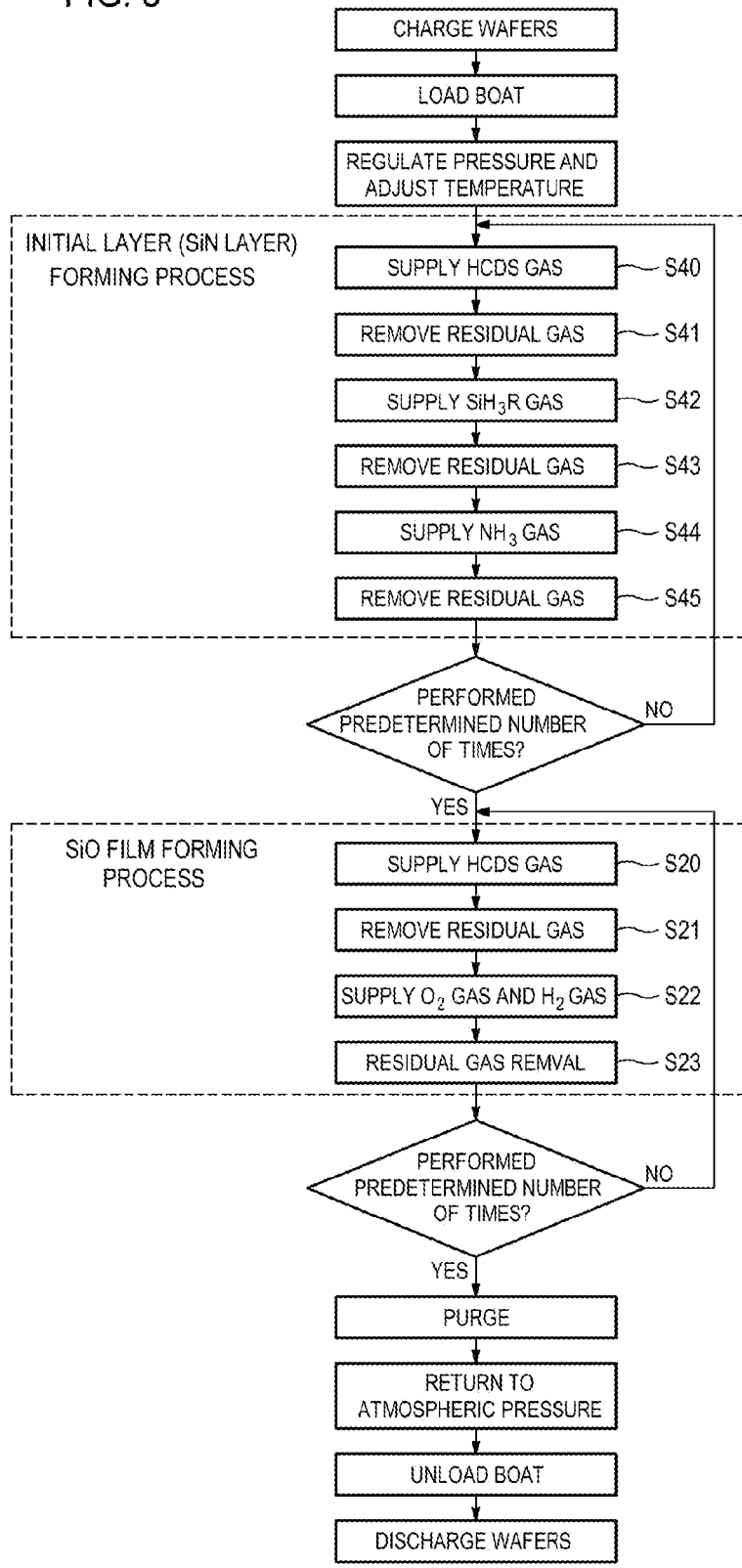
FIG. 8 illustrates a flowchart of processing according to a third embodiment of the present disclosure.
Figure 9:
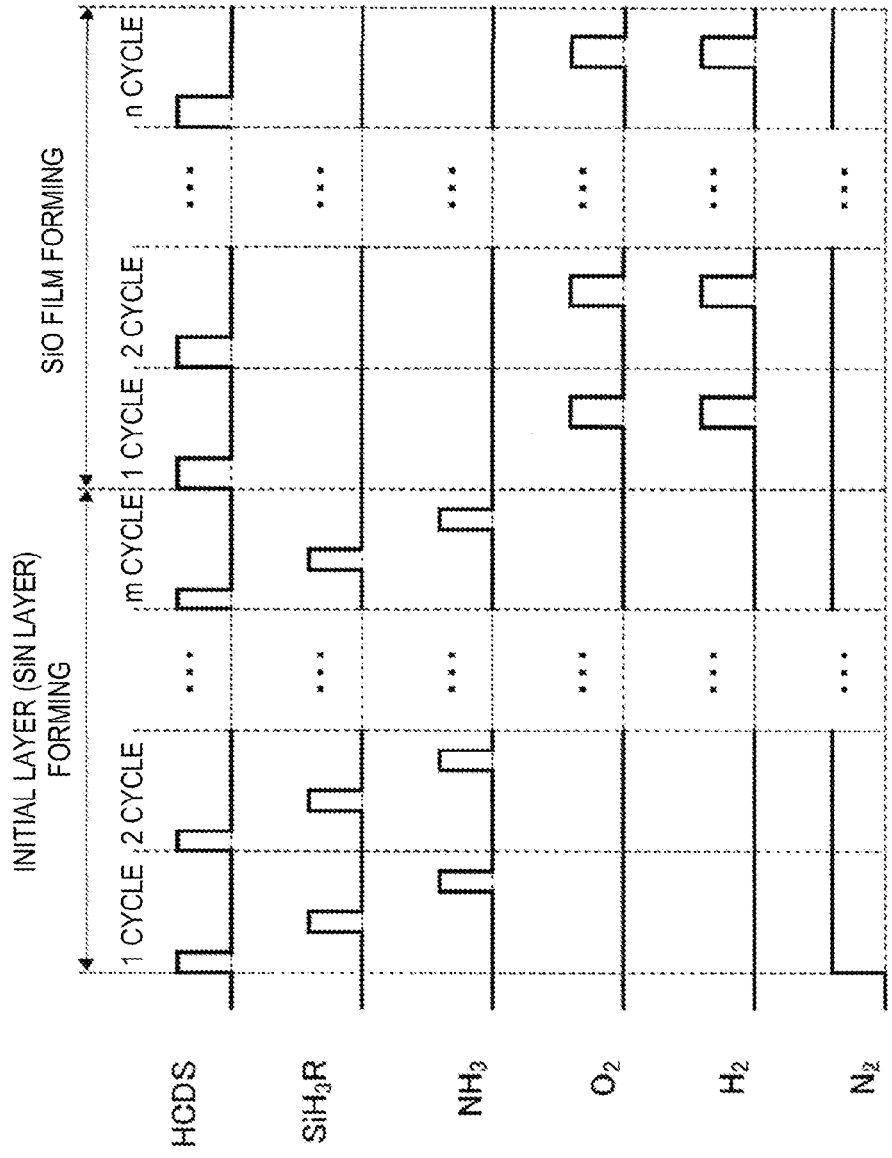
FIG. 9 illustrates gas supply timings in a film forming sequence according to the third embodiment of the present disclosure.

In a third embodiment, an HCDS gas as a chlorosilane-based precursor gas, a $SiH_3R$ gas as an aminosilane-based precursor gas, and an $NH_3$ gas as a nitriding gas are alternately supplied a predetermined number of times to form a silicon nitride layer (SiN layer) or a silicon-rich SiN layer as an initial layer on a wafer and form a silicon oxide film on the initial layer. Differences from the first embodiment will now be described with reference to FIGS. 8 and 9. FIG. 8 illustrates a flowchart of processing according to the third embodiment. FIG. 9 illustrates gas supply timings in a film forming sequence according to the third embodiment. The substrate processing process according to the present embodiment is performed in the processing furnace 202 of the substrate processing apparatus shown in FIGS. 1 and 2. The operations of the respective parts constituting the substrate processing apparatus are controlled by the controller 121.

Wafer charging, boat loading, pressure regulating, and temperature adjusting steps are performed through the same procedures as those of the respective steps of the above described embodiments.

Next, the SiN layer forming process is performed in which the HCDS gas, the $SiH_3R$ gas, and the $NH_3$ gas are supplied into the process chamber 201 to form the SiN layer as the initial layer on the wafer 200. In the SiN layer forming process, six steps (steps S40 to S45) to be described below are sequentially performed.

<Process for Forming Initial Layer (SiN Layer)>
[Steps S40 to S43]

An HCDS gas supply step (S40), a residual gas removal step (S41), a $SiH_3R$ gas supply step (S42), and a residual gas removal step (S43) are performed in the same manner as described with respect to steps S30 to S33 of the film forming sequence shown in FIGS. 6 and 7.

[Steps S44 and S45]

An $NH_3$ gas supply step (S44) and a residual gas removal step (S45) are performed in the same manner as described with respect to steps S12 and S13 of the film forming sequence shown in FIGS. 4 and 5.

A cycle including steps S40 to S45 described above is performed a predetermined number of times (e.g., m times) to form on the wafer 200 an initial layer (i.e., a SiN layer or a silicon-rich SiN layer) having a thickness of several atomic layers, specifically, greater than or equal to two atomic layers and less than or equal to six atomic layers.

<Process for Forming SiO Film>

Subsequently, a cycle including steps S20 to S23 which are identical with steps S20 to S23 of the film forming sequence shown in FIGS. 4 and 5 is performed a predetermined number of times, specifically, a plurality of times (e.g., n times) to form the SiO film having a predetermined thickness on the initial layer (i.e., the SiN layer or the silicon-rich SiN layer). In addition, the SiN layer as the initial layer is modified into a SiO film or a SiON film by the oxidation that occurs during the formation of the SiO film.

Thereafter, purging, returning-to-atmospheric-pressure, boat unloading, and wafer discharging steps are performed through the same procedures as those of the respective steps of the above described first embodiment.

Fourth Embodiment

Figure 10:
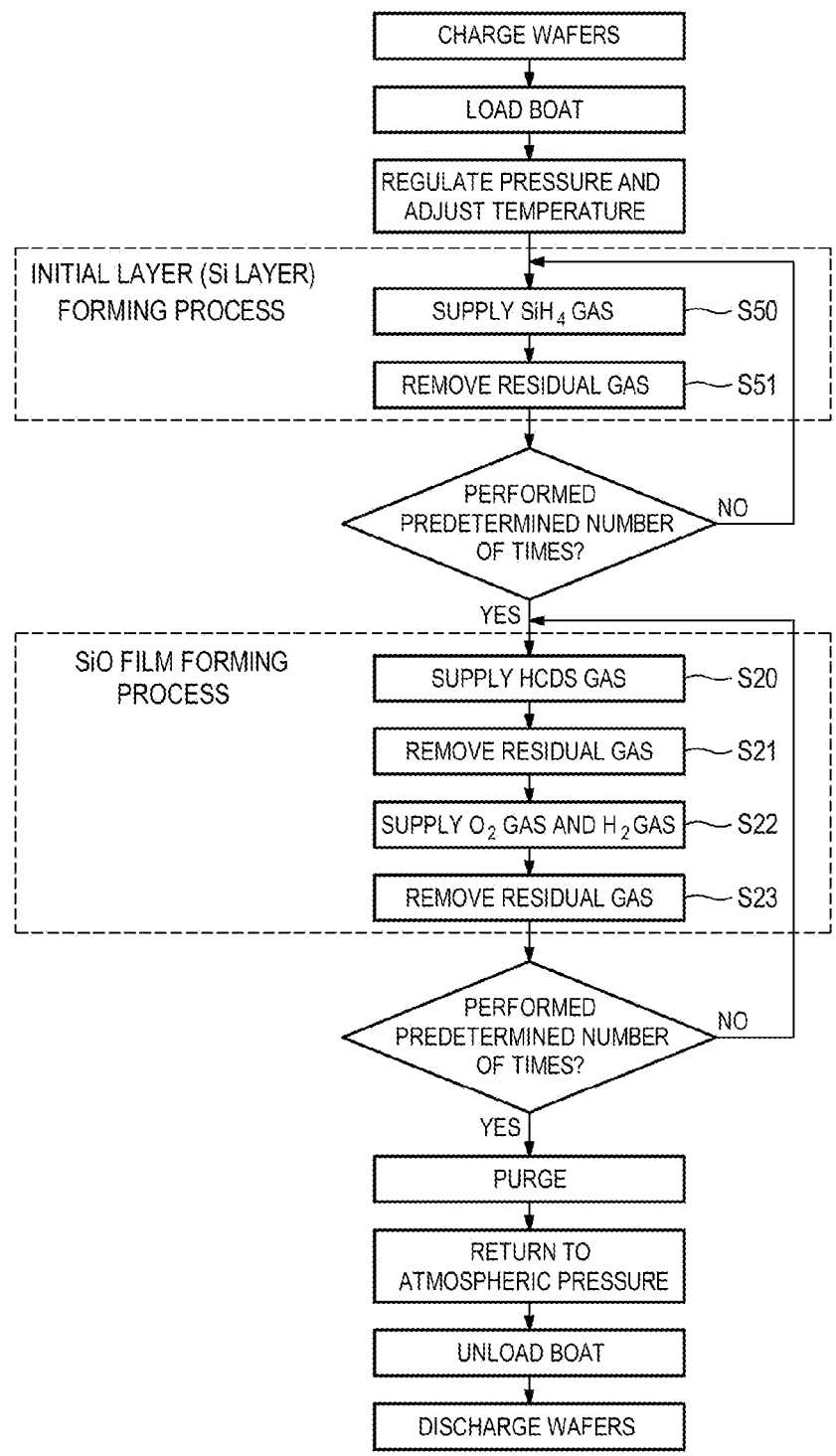
FIG. 10 illustrates a flowchart of processing according to a fourth embodiment of the present disclosure.
Figure 11:
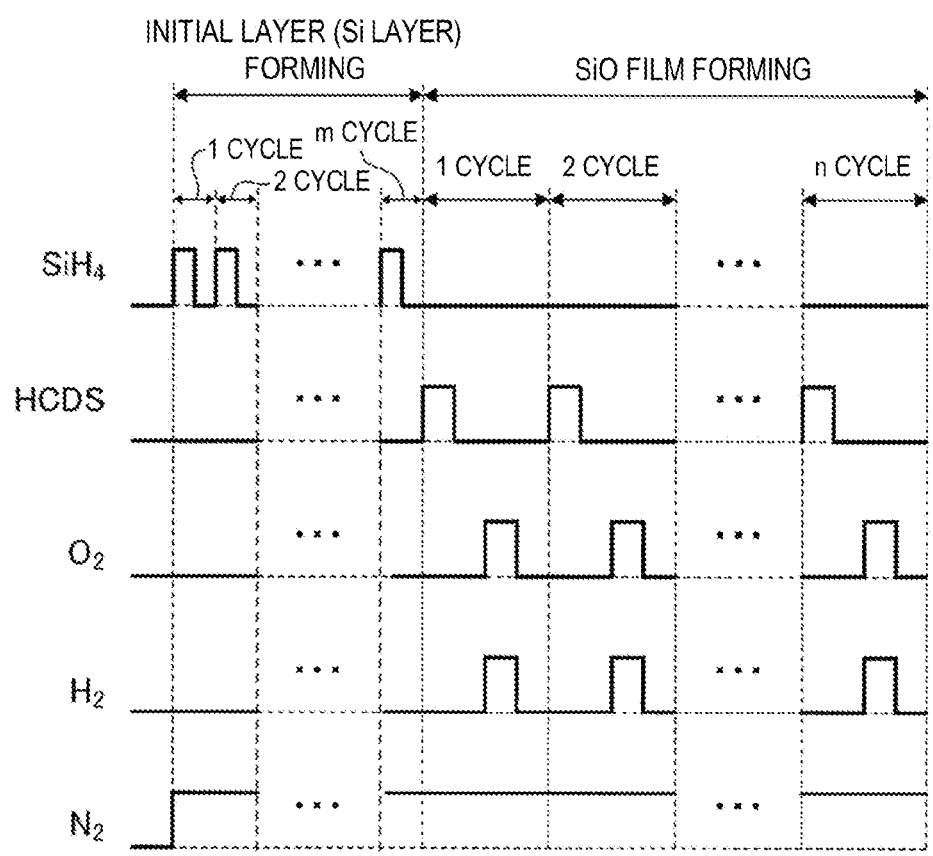
FIG. 11 illustrates gas supply timings in a film forming sequence according to the fourth embodiment of the present disclosure.

In a fourth embodiment, a Si layer as an initial layer is formed using a monosilane gas (e.g., a $SiH_4$ gas) as an inorganic silane-based precursor gas. A silicon oxide film is formed on the initial layer. Differences from the first embodiment will now be described with reference to FIGS. 10 and 11. FIG. 10 illustrates a flowchart of processing according to the fourth embodiment. FIG. 11 illustrates gas supply timings in a film forming sequence according to the fourth embodiment. The substrate processing process according to the present embodiment is performed in the processing furnace 202 of the substrate processing apparatus shown in FIGS. 1 and 2. The operations of the respective parts constituting the substrate processing apparatus are controlled by the controller 121.

Wafer charging, boat loading, pressure regulating, and temperature adjusting steps are performed through the same procedures as those of the respective steps of the above described embodiments.

Next, the Si layer forming process is performed in which the $SiH_4$ gas is supplied into the process chamber 201 to form the Si layer as the initial layer on the wafer 200. In the Si layer forming process, two steps (steps S50 and S51) to be described below are sequentially performed.
<Process for Forming Initial Layer (Si Layer)>
[Step S50]

The valve 243*i* of the sixth gas supply pipe 232*i* is opened to allow the $SiH_4$ gas to flow through the sixth gas supply pipe 232*i*. A flow rate of the $SiH_4$ gas flowing from the sixth gas supply pipe 232*i* is adjusted by the mass flow controller 241*i*. The flow-rate-adjusted $SiH_4$ gas is supplied from the gas supply holes 248*a* of the first nozzle 233*a* into the process chamber 201 maintained in a heated and depressurized state and is exhausted through the exhaust pipe 231 (i.e., $SiH_4$ gas supply).

At this time, the valve 243*l* of the sixth inert gas supply pipe 232*l* may be opened so that an $N_2$ gas as an inert gas can be supplied from the sixth inert gas supply pipe 232*l*. A flow rate of the $N_2$ gas is adjusted by the mass flow controller 241*l*. The $N_2$ gas is supplied into the sixth gas supply pipe 232*i*. The flow-rate-adjusted $N_2$ gas is mixed with the flow-rate-adjusted $SiH_4$ gas within the sixth gas supply pipe 232*i*. The $N_2$ gas is supplied from the gas supply holes 248*a* of the first nozzle 233*a* into the process chamber 201 maintained in a heated and depressurized state and is exhausted through the exhaust pipe 231. In this operation, the valves 243*d*, 243*e*, 243*f*, 243*j*, and 243*k* are opened to allow the $N_2$ gas to flow through the first inert gas supply pipe 232*d*, the second inert gas supply pipe 232*e*, the third inert gas supply pipe 232*f*, the fourth inert gas supply pipe 232*j*, and the fifth inert gas supply pipe 232*k* in order to prevent the $SiH_4$ gas from infiltrating into the buffer chamber 237, the second nozzle 233*b*, the first gas supply pipe 232*a*, and the fifth gas supply pipe 232*h*. The $N_2$ gas supplied into the second gas supply pipe 232*b*, the third gas supply pipe 232*c*, and the fourth gas supply pipe 232*g* is supplied into the process chamber 201 through the second nozzle 233*b* and the buffer chamber 237 and exhausted through the exhaust pipe 231.

In this case, the APC valve 244 is appropriately adjusted such that the internal pressure of the process chamber 201 falls within, for example, a range of 10 to 1,000 Pa, specifically, 30 to 300 Pa. The flow rate of the $SiH_4$ gas controlled by the mass flow controller 241*i* is set to fall within, for example, a range of 20 to 2,000 sccm. Each flow rate of the $N_2$ gas controlled by the mass flow controllers 241*d*, 241*e*, 241*f*, 241*j*, 241*k*, and 241*l* is set to fall within, for example, a range of 100 to 2,000 sccm. A time during which the $SiH_4$ gas is supplied to the wafers 200, in other words, a gas supply time (i.e., a gas irradiation time) is set to fall within, for example, a range of 1 to 1,800 seconds. Here, the temperature of the heater 207 is set such that the temperature of the wafers 200 falls within, for example, a range of 450 to 800 degree C., specifically, 500 to 600 degree C., more specifically, 500 to 550 degree C. By setting the processing conditions as described above, a CVD-Si layer as the silicon layer (Si layer) is formed on the wafer 200 (e.g., on the base film of the surface of the wafer 200).

Once the Si layer is formed on the wafer 200, the valve 243*i* of the sixth gas supply pipe 232*i* is closed to stop the supply of the $SiH_4$ gas. Here, while the APC valve 244 of the exhaust pipe 231 is in an open state, the interior of the process chamber 201 is vacuum-exhausted by the vacuum pump 246 to remove the $SiH_4$ gas remaining in the process chamber 201, which has not reacted or remains after contributing to the formation of the Si layer, from the process chamber 201 (i.e., residual gas removal). In this case, the supply of the $N_2$ gas as an inert gas into the process chamber 201 is maintained by keeping the valves 243*d*, 243*e*, 243*f*, 243*j*, 243*k*, and 243*l* in an open state. The $N_2$ gas acts as a purge gas, which makes it possible to enhance the effect of removing from the process chamber 201 the $SiH_4$ gas remaining in the process chamber 201, which has not been reacted or remains after contributing to the formation of the Si layer. At this time, similar to the first embodiment, the interior of the process chamber 201 may not be completely purged.

Similar to the case of supplying the $SiH_4$ gas, the temperature of the heater 207 is set such that the temperature of the wafers 200 falls within, for example, a range of 450 to 800 degree C., specifically, 500 to 600 degree C., more specifically, 500 to 550 degree C. Each flow rate of the $N_2$ gas as the purge gas supplied from the inert gas supply systems is set to fall within, for example, a range of 100 to 2,000 sccm. For the purge gas, it may be possible to use not only the $N_2$ gas but also a rare gas such as an Ar gas, a He gas, a Ne gas, a Xe gas, or the like.

Figure 12:
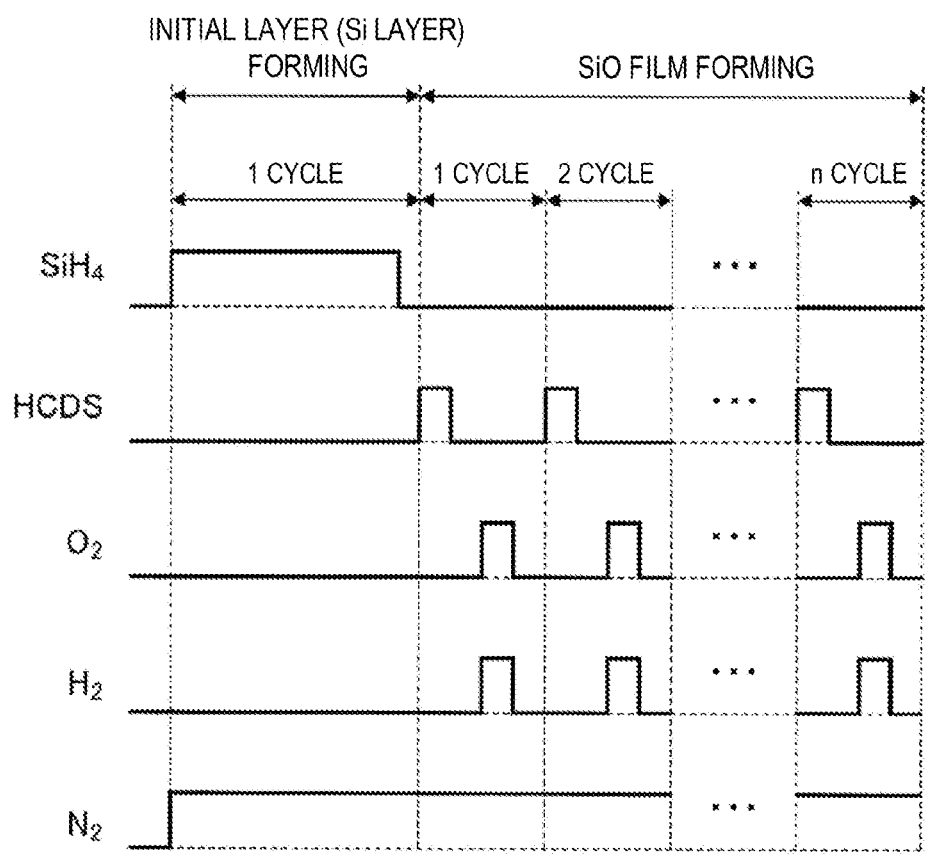
FIG. 12 illustrates gas supply timings in a film forming sequence according to the fourth embodiment of the present disclosure, in which a process of forming an initial layer illustrated in FIG. 11 is performed one cycle.

A cycle including steps S50 and S51 as described above is performed a predetermined number of times (e.g., m times) to form on the wafer 200 the initial layer (i.e., the silicon layer or the Si layer) having a thickness of several atomic layers, specifically, greater than or equal to two atomic layers and less than or equal to six atomic layers. FIG. 12 illustrates an example in which the $SiH_4$ gas is continuously supplied and, then, the purging (i.e., residual gas removal) is performed, that is, gas supply timings in which the cycle including steps S50 and S51 is performed once by setting the number m to be one, so that the Si layer as the initial layer having a thickness of several atomic layers can be formed on the wafer 200. In the present embodiment, the CVD-Si layer is formed by the supply of the SiH$_4$ gas. In other words, upon supplying the SiH$_4$ gas, SiH$_4$ is pyrolyzed and Si is deposited on the base film of the surface of the wafer 200. The crystalline structure of the Si layer is amorphous or polycrystalline. Therefore, the Si layer may be referred to as an amorphous silicon layer (a-Si layer) or a poly-silicon layer (poly-Si layer).

<Process for Forming SiO Film>

Subsequently, a cycle including steps S20 to S23 identical with steps S20 to S23 of the film forming sequence shown in FIGS. 4 and 5 is performed a predetermined number of times, specifically, a plurality of times (e.g., n times), to form the SiO film having a predetermined thickness on the initial layer (i.e., the Si layer). In addition, the Si layer as the initial layer is modified into a SiO film by the oxidation that occurs during the formation of the SiO film.

Thereafter, purging, returning-to-atmospheric-pressure, boat unloading, and wafer discharging steps are performed through the same procedures as those of the respective steps of the above described first embodiment.

Fifth Embodiment

Figure 13:
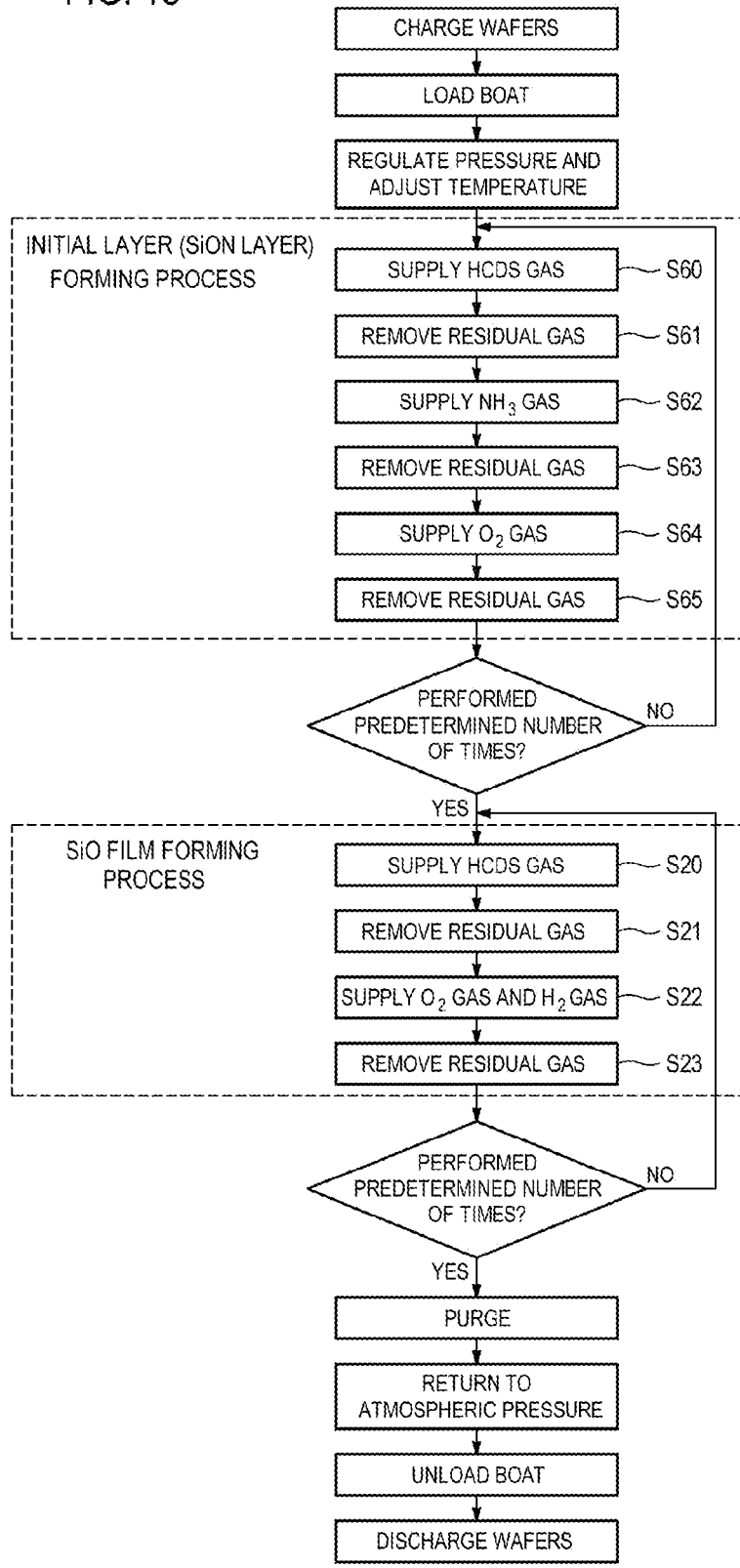
FIG. 13 illustrates a flowchart of processing according to a fifth embodiment of the present disclosure.
Figure 14:
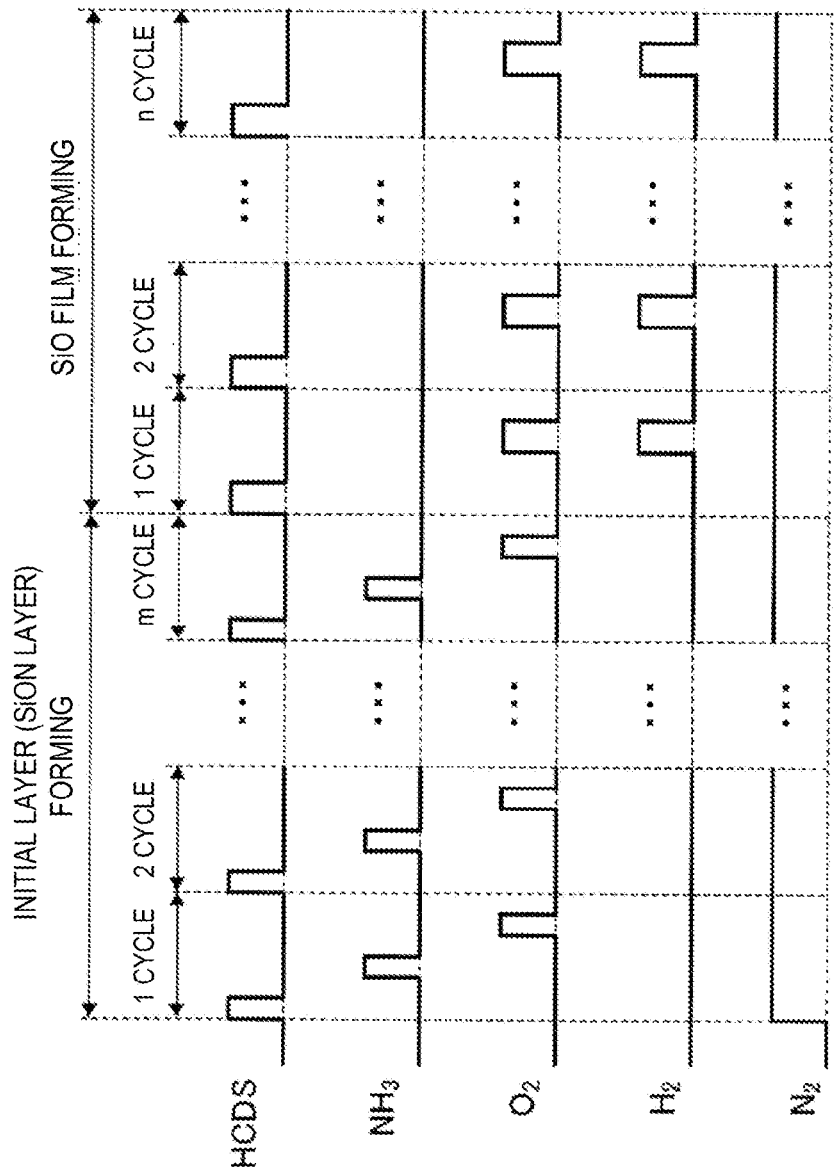
FIG. 14 illustrates gas supply timings in a film forming sequence according to the fifth embodiment of the present disclosure.

In a fifth embodiment, an HCDS gas as a chlorosilane-based precursor gas, an NH$_3$ gas as a nitriding gas, and an O$_2$ gas as an oxidizing gas are alternately supplied a predetermined number of times to form a silicon oxynitride layer (SiON layer) as an initial layer on a wafer and form a silicon oxide film on the initial layer. Differences from the first embodiment will now be primarily described with reference to FIGS. 13 and 14. FIG. 13 illustrates a flowchart of processing according to the fifth embodiment. FIG. 14 illustrates gas supply timings in a film forming sequence according to the fifth embodiment. The substrate processing process according to the present embodiment is performed in the processing furnace 202 of the substrate processing apparatus shown in FIGS. 1 and 2. The operations of the respective parts constituting the substrate processing apparatus are controlled by the controller 121.

Wafer charging, boat loading, pressure regulating, and temperature adjusting steps are performed through the same procedures as those of the respective steps of the aforementioned embodiments.

Next, the SiON layer forming process is performed in which the HCDS gas, the NH$_3$ gas and the O$_2$ gas are supplied into the process chamber 201 to form the SiON layer as the initial layer on the wafer 200. In the SiON layer forming process, six steps (steps S60 to S65) to be described below are sequentially performed.

<Process for Forming Initial Layer (SiON Layer)>

[Steps S60 to S63]

An HCDS gas supply step (S60), a residual gas removal step (S61), an NH$_3$ gas supply step (S62), and a residual gas removal step (S63) are performed in the manner as described with respect to steps S10 to S13 of the film forming sequence shown in FIGS. 4 and 5.

[Step S64]

After the residual gas within the process chamber 201 is removed, the valve 243b of the second gas supply pipe 232b is opened to allow the O$_2$ gas to flow through the second gas supply pipe 232b. A flow rate of the O$_2$ gas flowing from the second gas supply pipe 232b is adjusted by the mass flow controller 241b. The flow-rate-adjusted O$_2$ gas is supplied from the gas supply holes 248b of the second nozzle 233b into the buffer chamber 237 maintained in a heated and depressurized state via the second gas supply pipe 232b. The O$_2$ gas supplied into the buffer chamber 237 is supplied from the gas supply holes 248c of the buffer chamber 237 into the process chamber 201 maintained in a heated and depressurized state and exhausted through the exhaust pipe 231 (i.e., O$_2$ gas supply).

Here, the valve 243e of the second inert gas supply pipe 232e may be opened so that the N$_2$ gas as an inert gas can be supplied from the second inert gas supply pipe 232e. A flow rate of the N$_2$ gas is adjusted by the mass flow controller 241e. The N$_2$ gas is supplied into the second gas supply pipe 232b. For the inert gas, it may be possible to use not only the N$_2$ gas but also a rare gas such as an Ar gas, a He gas, a Ne gas, a Xe gas, or the like. In this operation, the valves 243d, 243f, 243j, 243k, and 243l are opened to allow the N$_2$ gas to flow through the first inert gas supply pipe 232d, the third inert gas supply pipe 232f, the fourth inert gas supply pipe 232j, the fifth inert gas supply pipe 232k, and the sixth inert gas supply pipe 232l in order to prevent the O$_2$ gas from infiltrating into the first nozzle 233a, the third gas supply pipe 232c, and the fourth gas supply pipe 232g. The N$_2$ gas having been supplied into the first gas supply pipe 232a, the fifth gas supply pipe 232h, and the sixth gas supply pipe 232i is supplied into the process chamber 201 through the first nozzle 233a and exhausted through the exhaust pipe 231.

Here, the APC valve 244 is appropriately adjusted such that the internal pressure of the process chamber 201 falls within, for example, a range of 10 to 5,000 Pa, which is lower than the atmospheric pressure. The flow rate of the O$_2$ gas controlled by the mass flow controller 241b is set to fall within, for example, a range of 1,000 to 10,000 sccm. Each flow rate of the N$_2$ gas controlled by the mass flow controllers 241d, 241e, 241f, 241j, 241k, and 241l is set to fall within, for example, a range of 100 to 2,000 sccm. Here, the partial pressure of the O$_2$ gas within the process chamber 201 is set to fall within a range of 0.6 to 4,600 Pa. A time during which the O$_2$ gas is supplied to the wafer 200, in other words, an O$_2$ gas supply time, is set to fall within, for example, a range of 1 to 120 seconds. The temperature of the heater 207 is set such that the temperature of the wafers 200 falls within the same temperature range as employed during the supply of the HCDS gas in step S60, specifically, within a range of 350 to 800 degree C., specifically, 450 to 800 degree C., more specifically, 550 to 750 degree C. If the temperature of the wafers 200 is within the above range, an effect of oxidation by the O$_2$ gas under a depressurized atmosphere, i.e., an oxidation reaction of a silicon nitride layer, is achieved. In addition, if the temperature of the wafers 200 is too low, such an oxidation effect cannot be achieved. As described above, taking the throughput into account, the temperature of the heater 207 may be set such that, throughout steps S60 to S64, the internal temperature of the process chamber 201 is kept in the same temperature range, that is, at a constant temperature within a range of 350 to 800 degree C., specifically, 450 to 800 degree C., more specifically, 550 to 750 degree C.

By supplying the O$_2$ gas into the process chamber 201 under the above described conditions, the O$_2$ gas is thermally activated in a non-plasma manner under a heated and depressurized atmosphere. In this case, neither the HCDS gas nor the NH$_3$ gas flows into the process chamber 201. Therefore, the O$_2$ gas does not make any gas phase reaction. The thermally-activated O$_2$ gas reacts with at least a portion of the SiN layer formed on the wafer 200 in step S64. Consequently, the SiN layer is subjected to oxidation so that the SiN layer is changed (i.e., modified) into a silicon oxynitride layer (hereinafter, referred to as a "SiON layer").

[Step S65]

Once the SiN layer formed in step S64 is changed into the SiON layer, the valve 243b of the second gas supply pipe 232b is closed to stop the supply of the $O_2$ gas. Here, while the APC valve 244 of the exhaust pipe 231 is in an open state, the interior of the process chamber 201 is vacuum-exhausted by the vacuum pump 246 to remove the residual $O_2$ gas and the reaction byproducts from the process chamber 201 (i.e., residual gas removal). The supply of the $N_2$ gas as an inert gas into the process chamber 201 is maintained by keeping the valves 243d, 243e, 243f, 243j, 243k, and 243l in an open state. The $N_2$ gas acts as a purge gas, which makes it possible to further enhance the effect of removing from the process chamber 201 the $O_2$ gas remaining in the process chamber 201, which has not reacted or remains after contributing to the formation of the SiON layer, and the reaction byproducts. Similar to the first embodiment, the interior of the process chamber 201 may not be completely purged.

A cycle including steps S60 to S65 as described above is performed a predetermined number of times (e.g., m times) to form on the wafer 200 the initial layer (i.e., the silicon oxynitride layer or the SiON layer) having a thickness of several atomic layers, specifically, greater than or equal to two atomic layers and less than or equal to six atomic layers.

<Process for Forming SiO Film>

Subsequently, a cycle including steps S20 to S23 identical with steps S20 to S23 of the film forming sequence shown in FIGS. 4 and 5 is performed a predetermined number of times, specifically, a plurality of times (e.g., n times) to form on the initial layer (i.e., the SiON layer) a SiO film having a predetermined thickness.

Thereafter, purging, returning-to-atmospheric-pressure, boat unloading, and wafer discharging steps are performed through the same procedures as those of the respective steps of the aforementioned first embodiment.

Other Embodiments of the Present Disclosure

While certain embodiments of the present disclosure have been specifically described hereinabove, the present disclosure is not limited to the aforementioned embodiments but may be differently modified without departing from the spirit of the present disclosure.

For example, in the above described embodiments, descriptions have been made on an example in which the substrate processing apparatus including the plasma source and the buffer chamber 237 is employed. However, the present disclosure is not limited to those embodiments. Therefore, the plasma source and the buffer chamber may not be installed. This configuration makes it possible to simplify the structure of the substrate processing apparatus and to reduce the manufacturing costs. In the above described embodiments, the $O_2$ gas and the $H_2$ gas are supplied into the process chamber 201 from the same nozzle. Alternatively, the HCDS gas and the $H_2$ gas may be supplied into the process chamber 201 from the same nozzle. In this case, it is only necessary that the end portion of the third gas supply pipe 232c is connected to the first gas supply pipe 232a at the more downstream side of the valve 243a.

For example, in the above described embodiments, descriptions have been made on an example in which, when forming the silicon-containing layer, the chlorosilane-based precursor gas is used as the precursor gas. However, instead of the chlorosilane-based precursor gas, it may be possible to use silane-based precursor gases having halogen-based ligands. For example, a fluorosilane-based precursor gas may be used in place of the chlorosilane-based precursor gas. In this regard, the fluorosilane-based precursor gas may be a silane-based precursor gas which has fluoro groups as halogen groups and which contains at least a silicon (Si) element and a fluorine (F) element. For the fluorosilane-based precursor gas, it may be possible to use, for example, a silicon fluoride gas such as a tetrafluorosilane gas, i.e., a silicon tetrafluoride ($SiF_4$) gas or a hexafluorodisilane ($Si_2F_6$) gas. In this case, when forming the silicon-containing layer, the fluorosilane-based precursor gas is supplied to the wafers 200 held within the process chamber 201.

In the above described embodiments, descriptions have been made on an example in which, in step S22 of the silicon oxide film forming process, the $O_2$ gas and the $H_2$ gas are supplied into the process chamber 201 maintained in a heated state and at a pressure lower than the atmospheric pressure and in which the silicon-containing layer is changed into the silicon oxide layer. However, the present disclosure is not limited thereto. Specifically, in step S22 of the silicon oxide film forming process, the $H_2$ gas may not be supplied and oxygen-containing gases such as an $O_2$ gas, an $O_3$ gas, and a $H_2O$ gas may be supplied independently. Moreover, the oxygen-containing gases may be supplied in a plasma-activated state.

In the above described embodiments, descriptions have been made on an example in which the HCDS gas, the $O_2$ gas, and the $H_2$ gas are alternately supplied into the process chamber 201 to form a silicon oxide film on the wafer 200. However, the present disclosure is not limited thereto. Therefore, an HCDS gas and an oxygen-containing gas such as an $O_2$ gas, an $O_3$ gas, and a $H_2O$ gas may be simultaneously supplied into the process chamber 201 to form a silicon oxide film on the wafer 200.

In the above described embodiments, descriptions have been made on an example in which a silicon-based thin film containing silicon, one of semiconductor elements, is formed as the thin film. However, the present disclosure is not limited thereto. Thus, the present disclosure may be appropriately applied to a case where a metal-based thin film containing a metallic element such as titanium (Ti), zirconium (Zr), hafnium (Hf), tantalum (Ta), aluminum (Al) or molybdenum (Mo) is formed as the thin film.

For example, when a titanium oxide film (TiO film) is formed as the metal-based thin film containing Ti, it may be possible to use, as the precursor gas, a gas containing Ti and chloro groups, such as a titanium tetrachloride ($TiCl_4$) gas or the like, or a gas containing Ti and fluoro groups, such as a titanium tetrafluoride ($TiF_4$) gas or the like. The same gases as used in the above described embodiments may be used as the oxygen-containing gas, the hydrogen-containing gas, and the nitrogen-containing gas. In this case, the processing conditions may be, e.g., the same as the processing conditions used in the aforementioned embodiments.

For example, when a zirconium oxide film (ZrO film) is formed as the metal-based thin film containing Zr, it may be possible to use, as the precursor gas, a gas containing Zr and chloro groups, such as a zirconium tetrachloride ($ZrCl_4$) gas or the like, or a gas containing Zr and fluoro groups, such as a zirconium tetrafluoride ($ZrF_4$) gas or the like. The same gases as used in the aforementioned embodiments may be used as the oxygen-containing gas, the hydrogen-containing gas, and the nitrogen-containing gas. In this case, the processing conditions may be, for example, the same as the processing conditions used in the aforementioned embodiments.

For example, when a hafnium oxide film (HfO film) is formed as the metal-based thin film containing Hf, it may be possible to use, as the precursor gas, a gas containing Hf and chloro groups, such as a hafnium tetrachloride ($HfCl_4$) gas or the like, or a gas containing Hf and fluoro groups, such as a hafnium tetrafluoride (HfF$_4$) gas or the like. The same gases as used in the above described embodiments may be used as the oxygen-containing gas, the hydrogen-containing gas, and the nitrogen-containing gas. In this case, the processing conditions may be, for example, the same as the processing conditions used in the aforementioned embodiments.

For example, when a tantalum oxide film (TaO film) is formed as the metal-based thin film containing Ta, it may be possible to use, as the precursor gas, a gas containing Ta and chloro groups, such as a tantalum pentachloride (TaCl$_5$) gas or the like, or a gas containing Ta and fluoro groups, such as a tantalum pentafluoride (TaF$_5$) gas or the like. The same gases as used in the above described embodiments may be used as the oxygen-containing gas, the hydrogen-containing gas, and the nitrogen-containing gas. In this case, the processing conditions may be, for example, the same as the processing conditions used in the aforementioned embodiments.

For example, when an aluminum oxide film (AlO film) is formed as the metal-based thin film containing Al, it may be possible to use, as the precursor gas, a gas containing Al and chloro groups, such as an aluminum trichloride (AlCl$_3$) gas or the like, or a gas containing Al and fluoro groups, such as an aluminum trifluoride (AlF$_3$) gas or the like. The same gases as used in the above described embodiments may be used as the oxygen-containing gas, the hydrogen-containing gas, and the nitrogen-containing gas. In this case, the processing conditions may be, for example, the same as the processing conditions used in the aforementioned embodiments.

For example, when a molybdenum oxide film (MoO film) is formed as the metal-based thin film containing Mo, it may be possible to use, as the precursor gas, a gas containing Ta and chloro groups, such as a molybdenum pentachloride (MoCl$_5$) gas or the like, or a gas containing Mo and fluoro groups, such as a molybdenum pentafluoride (MoF$_5$) gas or the like. The same gases as used in the above described embodiments may be used as the oxygen-containing gas, the hydrogen-containing gas and the nitrogen-containing gas. In this case, the processing conditions may be, for example, the same as the processing conditions used in the aforementioned embodiments.

As described above, the present disclosure can be applied to not only formation of silicon-based thin films but also formation of metal-based thin films. In this case, it is possible to obtain the same effects as obtained in the above described embodiments. In other words, the present disclosure can be appropriately applied to a case where a thin film containing a predetermined element such as a semiconductor element or a metal element is formed.

In the above described embodiments, descriptions have been made on an example in which the thin film is formed using a batch type substrate processing apparatus for processing a plurality of substrates at a time. However, the present disclosure is not limited thereto but may be appropriately applied to a case in which the thin film is formed using a substrate-by-substrate type substrate processing apparatus for processing one or more substrates at a time. In the above described embodiments, descriptions have been made on an example in which the thin film is formed using a substrate processing apparatus having a hot-wall type processing furnace. However, the present disclosure is not limited thereto but may be appropriately applied to a case in which the thin film is formed using a substrate processing apparatus having a cold-wall type processing furnace.

The above described embodiments, the modifications, the application examples and the like may be appropriately combined and used.

In addition, the present disclosure can be implemented by, e.g., modifying a process recipe of an existing substrate processing apparatus. In cases of modifying the process recipe, the process recipe according to the present disclosure may be installed in the existing substrate processing apparatus through an electrical communication line or a recording medium storing the process recipe, or the process recipe itself may be changed to the process recipe according to the present disclosure by manipulating an input/output device of the existing substrate processing apparatus.

<Additional Aspects of the Present Disclosure>

Some Additional aspects of the present disclosure will be described below.

(Supplementary Note 1)

According to one aspect of the present disclosure, there is provided a method of manufacturing a semiconductor device, including forming an initial layer including a predetermined element and having a thickness of several atomic layers on a substrate in a process chamber by supplying a predetermined-element-containing gas to the substrate; and forming an oxide film including the predetermined element on the initial layer by performing a cycle a predetermined number of times, the cycle including supplying a precursor gas including the predetermined element to the substrate in the process chamber and supplying an oxygen-containing gas and a hydrogen-containing gas to the substrate heated in the process chamber under a pressure lower than an atmospheric pressure.

(Supplementary Note 2)

In the method of Supplementary Note 1, the initial layer may include at least one of a layer composed of the predetermined-element, a nitride layer, and an oxynitride layer.

(Supplementary Note 3)

In the method of Supplementary Note 1, the initial layer may include a nitride layer in which a ratio of the predetermined element is greater than a ratio of the predetermined element in a nitride layer having a stoichiometric composition (i.e., a predetermined-element-rich nitride layer).

(Supplementary Note 4)

In the method of Supplementary Note 1, the act of forming the initial layer may include forming a nitride layer as the initial layer by performing a cycle a predetermined number of times, the cycle including supplying the predetermined-element-containing gas to the substrate in the process chamber and supplying a nitriding gas to the substrate in the process chamber (Supplementary Note 5)

In the method of Supplementary Note 4, the nitride layer may be formed to have a ratio of the predetermined element greater than a ratio of the predetermined element in a nitride layer having a stoichiometric composition (i.e., a predetermined-element-rich nitride layer) by making an unsaturated nitriding reaction which occurs in the act of supplying the nitriding gas.

(Supplementary Note 6)

In the method of Supplementary Note 1, the act of forming the initial layer may include forming a nitride layer as the initial layer by performing a cycle a predetermined number of times, the cycle including supplying the predetermined-element-containing gas including a halogen group to the substrate in the process chamber, supplying the predetermined-element-containing gas including an amino group to the substrate in the process chamber, and supplying a nitriding gas to the substrate in the process chamber.

(Supplementary Note 7)

In the method of Supplementary Note 6, the nitride layer may be formed to have a ratio of the predetermined element greater than a ratio of the predetermined element in a nitride layer having a stoichiometric composition (i.e., a predetermined-element-rich nitride layer) by making an unsaturated nitriding reaction which occurs in the act of supplying the nitriding gas.

(Supplementary Note 8)

In the method of Supplementary Note 1, the act of forming the initial layer may include forming a layer composed of the predetermined element as the initial layer by performing a cycle a predetermined number of times, the cycle including supplying the predetermined-element-containing gas including a halogen group to the substrate in the process chamber and supplying the predetermined-element-containing gas including an amino group to the substrate in the process chamber.

(Supplementary Note 9)

In the method of Supplementary Note 1, the act of forming the initial layer may include forming an oxynitride layer as the initial layer by performing a cycle a predetermined number of times, the cycle including supplying the predetermined-element-containing gas to the substrate in the process chamber, supplying a nitriding gas to the substrate in the process chamber, and supplying an oxidizing gas to the substrate in the process chamber.

(Supplementary Note 10)

In the method of any one of Supplementary Notes 1 to 5, the predetermined-element-containing gas and the precursor gas including the predetermined element may be constituted by an identical material.

(Supplementary Note 11)

In the method of any one of Supplementary Notes 6 to 9, the predetermined-element-containing gas including the halogen group and the precursor gas including the predetermined element may be constituted by an identical material.

(Supplementary Note 12)

In the method of any one of Supplementary Notes 1 to 11, the initial layer may have a thickness greater than or equal to two atomic layers and less than or equal to six atomic layers.

(Supplementary Note 13)

In the method of any one of Supplementary Notes 4 to 9, the act of forming the initial layer may include repeating a cycle a predetermined number of times, the cycle alternately performing the act of supplying the predetermined-element-containing gas and the act of supplying the nitriding gas.

(Supplementary Note 14)

In the method of any one of Supplementary Notes 1 to 13, the act of forming the oxide film may include repeating a cycle a predetermined number of times, the cycle alternately performing the act of supplying the precursor gas and the act of supplying the oxygen-containing gas and the hydrogen-containing gas.

(Supplementary Note 15)

According to another aspect of the present disclosure, there is provided a method of processing a substrate, including forming an initial layer including a predetermined element and having a thickness of several atomic layers on the substrate in a process chamber by supplying a predetermined-element-containing gas to the substrate; and forming an oxide film including the predetermined element on the initial layer by performing a cycle a predetermined number of times, the cycle including supplying a precursor gas including the predetermined element to the substrate in the process chamber and supplying an oxygen-containing gas and a hydrogen-containing gas to the substrate heated in the process chamber under a pressure lower than an atmospheric pressure.

(Supplementary Note 16)

According to a further aspect of the present disclosure, there is provided a substrate processing apparatus, including a process chamber configured to accommodate a substrate; a heater configured to heat the substrate accommodated in the process chamber; a gas supply system configured to supply gas into the process chamber; a pressure regulating unit configured to regulate an internal pressure of the process chamber; and a control unit configured to control the gas supply system, the heater, and the pressure regulating unit so as to perform forming an initial layer including a predetermined element and having a thickness of several atomic layers on the substrate in the process chamber by supplying a predetermined-element-containing gas from the gas supply system to the substrate; and forming an oxide film including the predetermined element on the initial layer by performing a cycle a predetermined number of times, the cycle including supplying a precursor gas including the predetermined element from the gas supply system to the substrate in the process chamber and supplying an oxygen-containing gas and a hydrogen-containing gas from the gas supply system to the substrate heated by the heater in the process chamber under a pressure controlled by the pressure regulating unit to be set lower than an atmospheric pressure.

(Supplementary Note 17)

According to a still further aspect of the present disclosure, there is provided a program that causes a computer to perform a process of forming an initial layer including a predetermined element and having a thickness of several atomic layers on a substrate in a process chamber by supplying a predetermined-element-containing gas to the substrate; and forming an oxide film including the predetermined element on the initial layer by performing a cycle a predetermined number of times, the cycle including supplying a precursor gas including the predetermined element to the substrate in the process chamber and supplying an oxygen-containing gas and a hydrogen-containing gas to the substrate heated in the process chamber under a pressure lower than an atmospheric pressure.

(Supplementary Note 18)

According to a yet still further aspect of the present disclosure, there is provided a non-transitory computer-readable recording medium storing a program that causes a computer to perform a process of forming an initial layer including a predetermined element and having a thickness of several atomic layers on a substrate in a process chamber by supplying a predetermined-element-containing gas to the substrate; and forming an oxide film including the predetermined element on the initial layer by performing a cycle a predetermined number of times, the cycle including supplying a precursor gas including the predetermined element to the substrate in the process chamber and supplying an oxygen-containing gas and a hydrogen-containing gas to the substrate heated in the process chamber under a pressure lower than an atmospheric pressure.

According to the method of manufacturing a semiconductor device, the substrate processing apparatus, and the recording medium, it is possible to suppress oxidization of a base film exiting on a substrate surface during the formation of an oxide film.

While certain embodiments have been described, these embodiments have been presented by way of example only, and are not intended to limit the scope of the disclosures. Indeed, the novel method, apparatus and recording medium described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming an initial layer including a predetermined element and having a thickness greater than or equal to two atomic layers and less than or equal to six atomic layers on a substrate in a process chamber by supplying a predetermined-element-containing gas to the substrate; and
    forming an oxide film including the predetermined element on the initial layer by performing a cycle a predetermined number of times, the cycle comprising supplying a precursor gas including the predetermined element to the substrate in the process chamber and supplying an oxygen-containing gas and a hydrogen-containing gas to the substrate heated in the process chamber under a pressure lower than an atmospheric pressure,
    wherein the initial layer serves as a layer for preventing oxidation of a surface of the substrate during the forming of the oxide film.

2. The method of claim 1, wherein the initial layer includes a nitride layer in which a ratio of the predetermined element is greater than a ratio of the predetermined element in a nitride layer having a stoichiometric composition.

3. The method of claim 1, wherein the act of forming the initial layer includes forming a nitride layer as the initial layer by performing a cycle a predetermined number of times, the cycle comprising supplying the predetermined-element-containing gas to the substrate in the process chamber and supplying a nitriding gas to the substrate in the process chamber.

4. The method of claim 3, wherein the nitride layer is formed to have a ratio of the predetermined element greater than a ratio of the predetermined element in a nitride layer having a stoichiometric composition by making an unsaturated nitriding reaction which occurs in the act of supplying the nitriding gas.

5. The method of claim 3, wherein the act of forming the initial layer includes repeating a cycle a predetermined number of times, the cycle alternately performing the act of supplying the predetermined-element-containing gas and the act of supplying the nitriding gas.

6. The method of claim 1, wherein the act of forming the initial layer includes forming a nitride layer as the initial layer by performing a cycle a predetermined number of times, the cycle comprising supplying the predetermined-element-containing gas including a halogen group to the substrate in the process chamber, supplying the predetermined-element-containing gas including an amino group to the substrate in the process chamber, and supplying a nitriding gas to the substrate in the process chamber.

7. The method of claim 6, wherein the nitride layer is formed to have a ratio of the predetermined element greater than a ratio of the predetermined element in a nitride layer having a stoichiometric composition by making an unsaturated nitriding reaction which occurs in the act of supplying the nitriding gas.

8. The method of claim 6, wherein the predetermined-element-containing gas including the halogen group and the precursor gas including the predetermined element are constituted by an identical material.

9. The method of claim 1, wherein the act of forming the initial layer includes forming a layer composed of the predetermined element as the initial layer by performing a cycle a predetermined number of times, the cycle comprising supplying the predetermined-element-containing gas including a halogen group to the substrate in the process chamber and supplying the predetermined-element-containing gas including an amino group to the substrate in the process chamber.

10. The method of claim 1, wherein the act of forming the initial layer includes forming an oxynitride layer as the initial layer by performing a cycle a predetermined number of times, the cycle comprising supplying the predetermined-element-containing gas to the substrate in the process chamber, supplying a nitriding gas to the substrate in the process chamber, and supplying an oxidizing gas to the substrate in the process chamber.

11. The method of claim 1, wherein the predetermined-element-containing gas and the precursor gas including the predetermined element are constituted by an identical material.

12. The method of claim 1, wherein the act of forming the oxide film includes repeating a cycle a predetermined number of times, the cycle alternately performing the act of supplying the precursor gas and the act of supplying the oxygen-containing gas and the hydrogen-containing gas.

13. The method of claim 1, wherein the act of forming the oxide film includes changing at least a portion of the initial layer into the oxide film or an oxynitride film.

14. The method of claim 1, wherein the act of forming the oxide film includes changing an entire portion of the initial layer into the oxide film or an oxynitride film.

15. A method of manufacturing a semiconductor device, comprising:
    forming an initial layer including a layer composed of a predetermined element and at least one of a nitride layer and an oxynitride layer, the initial layer having a thickness greater than or equal to two atomic layers and less than or equal to six atomic layers on a substrate in a process chamber by supplying a predetermined-element-containing gas to the substrate; and
    forming an oxide film including the predetermined element on the initial layer by performing a cycle a predetermined number of times, the cycle comprising supplying a precursor gas including the predetermined element to the substrate in the process chamber and supplying an oxygen-containing gas and a hydrogen-containing gas to the substrate heated in the process chamber under a pressure lower than an atmospheric pressure,
    wherein the initial layer serves as a layer for preventing oxidation of a surface of the substrate during the forming of the oxide film.

* * * * *